(12) United States Patent
Asano et al.

(10) Patent No.: US 8,937,844 B2
(45) Date of Patent: Jan. 20, 2015

(54) APPARATUS FOR GENERATING WRITE DATA AND READOUT DATA

(75) Inventors: Shigehiro Asano, Kanagawa (JP);
Toshikatsu Hida, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 266 days.

(21) Appl. No.: 13/406,945

(22) Filed: Feb. 28, 2012

(65) Prior Publication Data

US 2013/0077419 A1 Mar. 28, 2013

(30) Foreign Application Priority Data

Sep. 22, 2011 (JP) .................................. 2011-207923

(51) Int. Cl.
| | | |
|---|---|---|
| *G11C 29/00* | (2006.01) | |
| *G11C 11/34* | (2006.01) | |
| *G11C 7/10* | (2006.01) | |
| *G11C 29/44* | (2006.01) | |

(52) U.S. Cl.
CPC ............ *G11C 7/1036* (2013.01); *G11C 29/848* (2013.01); *G11C 2029/4402* (2013.01)
USPC ........................ 365/200; 365/201; 365/185.09

(58) Field of Classification Search
CPC ...... G11C 29/50; G11C 11/401; G11C 29/02; G11C 29/34; G11C 7/1006; G11C 7/1051; G11C 7/1078; G11C 7/22; G11C 7/1012; G11C 8/12; G11C 8/10; G11C 11/4076; G11C 8/00; G11C 7/18; G11C 5/025; G11C 7/10

USPC .......... 365/201, 189.02, 230.02, 230.03, 200, 365/185.09; 369/83

See application file for complete search history.

(56) References Cited

U.S. PATENT DOCUMENTS

| | | | | |
|---|---|---|---|---|
| 5,313,425 | A * | 5/1994 | Lee et al. ....................... | 365/201 |
| 6,567,323 | B2 | 5/2003 | Pitts et al. | |
| 6,996,017 | B2 * | 2/2006 | Scheuerlein et al. ......... | 365/201 |
| 2009/0161429 | A1 * | 6/2009 | Chen et al. ................ | 365/185.09 |

OTHER PUBLICATIONS

Office Action issued Jun. 3, 2014 in Japanese Patent Application No. 2011-207923 (with English language translation).

* cited by examiner

*Primary Examiner* — Richard Elms
*Assistant Examiner* — Ajay Ojha
(74) *Attorney, Agent, or Firm* — Oblon, Spivak, McClelland, Maier & Neustadt, L.L.P.

(57) ABSTRACT

An apparatus according to an embodiment comprises a first storage, a second storage, an input unit, a shift number determining unit, and an output unit. The first storage stores identification information of sectors and defective information indicating a presence of defect on the data line, while associating the identification information and the defective information. The second storage has storage regions in a number larger than the first number. The input unit inputs data to the second storage by the first number at a time. The shift number determining unit determines a shift number. The output unit outputs the data stored in the storage regions which is after a head storage region by the shift number, as the data is to be supplied to the data line having no defect sector based upon the defective information, and outputs information that differs from the data to the defective data line.

9 Claims, 22 Drawing Sheets

FIG.22

| BYTE POSITION | INTEGRATION BYTE SHIFT | INTEGRATION BIT SHIFT | DEFECTIVE BIT VECTOR |
|---|---|---|---|
| 0 | 0 | 4 | 0011010001000000 |
| 1 | 1 | 2 | 1010001001110000 |
| 2 | 1 | 5 | 0100101000000000 |
| 4 | 1 | 7 | 0100010000000000 |

APPARATUS FOR GENERATING WRITE DATA AND READOUT DATA

CROSS-REFERENCE TO RELATED APPLICATION(S)

This application is based upon and claims the benefit of priority from Japanese Patent Application No. 2011-207923, filed on Sep. 22, 2011; the entire contents of which are incorporated herein by reference.

FIELD

Embodiments described herein relate generally to a data generation apparatus.

BACKGROUND

In the conventional art, a known memory system would be such that includes memory devices arranged in a matrix on intersections of plural word lines extending in a row direction and plural data lines extending in a column direction. With such memory systems a known technique used would be such in which redundant columns are previously integrated in the memory system, that always a redundant column to be selected instead of a bad column.

The conventional technique usually requires a circuit (e.g., multiplexer) for outputting a predetermined number of data while replacing the bad columns. However, there is a problem in that when the number of data to be outputted is large, wiring becomes complicated while a circuit scale becomes larger.

BRIEF DESCRIPTION OF THE DRAWINGS

FIG. 22 is a view illustrating an example of a data structure of a bad-column storage unit according to the embodiment.

DETAILED DESCRIPTION

Figure 1:
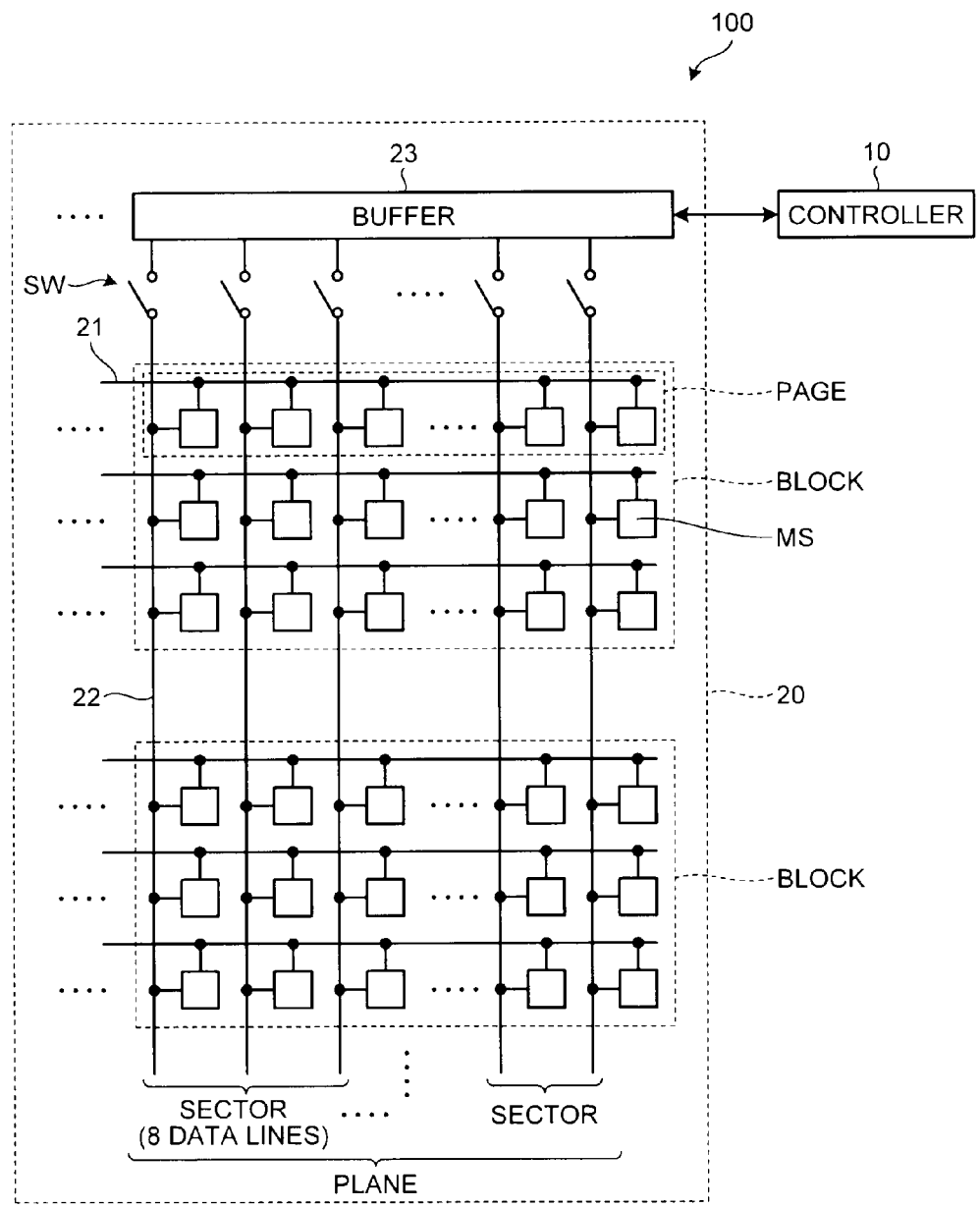
FIG. 1 is a block diagram illustrating a memory system according to an embodiment.

FIG. 1 is a block diagram illustrating a schematic configuration of a memory system 100 according to an embodiment of the present invention. As illustrated in FIG. 1, the memory system 100 is configured as including a controller 10 and a memory cell array 20. The memory cell array 20 includes plural memory cells MS arranged in a matrix. Each of the memory cells MS is arranged on each of the intersections of plural word lines 21 extending in a row direction and plural data lines (bit lines) 22 extending in a column direction. In FIG. 1, the memory cell array 20 is divided into plural regions by a predetermined number (e.g., 64) of the data lines 22, and each divided region is referred to as a plane. Each plane has peripheral circuits (e.g., buffer 23, row decoder (not shown), column decoder (not shown), etc.). The peripheral circuits for each plane are independent from the other peripheral circuits for the other planes. The data lines 22 belonging to each plane include redundant sections.

In an example shown in FIG. 1, each plane is divided into plural regions in the row direction, and each divided region is referred to as a block. Each block is composed of plural regions each of which is called a page. In the example shown in FIG. 1, each page is a region including a single word line 21. Specifically, each page is constructed from 64 memory cells connected to a common word line 21. In the example shown in FIG. 1, each plane is divided into plural regions in the column direction, while each divided region is referred to as a sector. Each sector is a region including a predetermined number (a first number) of data lines 22. In the example shown in FIG. 1, each sector is a region including eight data lines 22, which indicate that a single plane is divided into eight sectors. The structure is not limited to such example while the number of the data lines 22 included in each sector can be arranged arbitarily. In the example shown in FIG. 1, it can be said that each page (or each block) is divided into eight regions in the column direction by the sectors.

The data is written to the memory cells MS in a unit of a page. For example, when data is written to a predetermined page, the controller 10 generates write data in a serial form one by one for each sector, and transmits the generated data to the buffer 23. In FIG. 1, bytewise (8-bit unit) write data is generated one by one, and transmitted to the buffer 23. After the write data for one page is transmitted to the buffer 23, the word lines 21 corresponding to the page to which the data is written are selected, and plural selection transistors SW present between the buffer 23 and each data line 22 are turned on all at the same time. With this process, the data is written to each of plural (64) memory cells connected to the selected word line 21.

The data is read from the memory cells MS on a page basis. When data is read from a predetermined page, for example, the word line 21 corresponding to that page (the page from which the data is read) is selected, and plural selection transistors SW are selected all at the same time. With this process, the data stored in each of the plural memory cells MS connected to the selected word line 21 is simultaneously sent to the buffer 23 via the data lines 22. The data sent to the buffer 23 is divided into byte units, and transmitted one by one to the controller 10.

Generation Of Write Data

Figure 2:
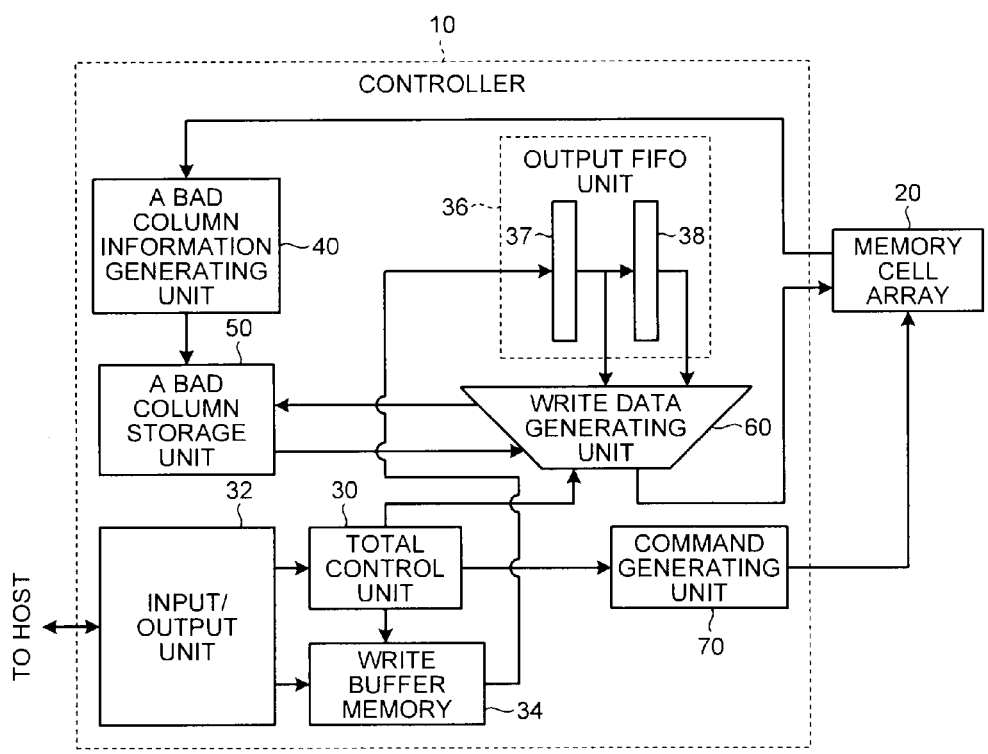
FIG. 2 is a block diagram illustrating a controller according to the embodiment.

Next, the function of the controller 10 that generates write data will be described. The controller 10 can be considered as a data generation apparatus that generates write data. FIG. 2 is a block diagram illustrating an example of a schematic configuration of the controller 10. FIG. 2 mainly illustrates portions necessary for the generation of the write data, but there are portions that are not necessarily being illustrated, such as the portions necessary for the generation of readout data, which will be described later on for example. As illustrated in FIG. 2, the controller 10 includes a total control unit 30, an input/output unit 32, a write buffer memory 34, an output FIFO unit 36, a bad-column information generating unit 40, a bad-column storage unit 50, a write data generating unit 60, and a command generating unit 70.

The total control unit 30 controls the whole controller 10. The input/output unit 32 sends the data, having been transmitted from an unillustrated host device, to the write buffer memory 34 on a page basis. The data written in the write buffer memory 34 is supplied to the output FIFO unit 36 on a byte basis under the control of the total control unit 30. The output FIFO unit 36 in the present embodiment, as illustrated in FIG. 2, includes an 8-bit first register 37 and an 8-bit second register 38, which are connected in series. Each of the first register 37 and the second register 38 includes eight storage regions that can store 1-bit data. In the present embodiment, data is inputted to the output FIFO unit 36 in a unit of eight bits. When receiving the input of the 8-bit data, the output FIFO unit 36 writes the 8-bit data, which has already been stored in the first register 37, to the second register 38, and writes the inputted 8-bit data to the first register 37. Specifically, the data stored in the output FIFO unit 36 is shifted in a unit of eight bits every time 8-bit data is inputted. From another aspect, it can be considered that the output FIFO unit 36 has 16 storage regions connected in series. In the description below, the storage region corresponding to the bit of the most significant digit out of 8-bit data that can be stored in the second register 38 is referred to as a "head storage region", while the storage region corresponding to the bit of the least significant digit out of 8-bit data that can be stored in the first register 37 is referred to as a "terminal storage region", for example. It can also be considered that, when receiving the input of the 8-bit data, the output FIFO unit 36 writes only eight data, which have already been stored in the storage region, to the storage regions on the head side, and writes the inputted 8-bit data to each of eight storage regions counting from the terminal side.

The bad-column information generating unit 40 detects as to whether each data line 22 has a defect or not before the factory shipment, so as to generate bad-column information and writes that created bad-column information to the bad-column storage unit 50. The method of creating the bad-column information is optional. For example, based on a value of a current flowing through each data line 22 the data line 22 is determined as to whether it is defective or not, and the bad-column information can be created by using the result of such determination.

The write data generating unit 60 generates bytewise (8-bit unit) write data in a byte unit by using 16 data stored in the output FIFO unit 36 and the bad-column information stored in the bad-column storage unit 50, and outputs the resultant to the unillustrated buffer 23. The detail will be described later on. The command generating unit 70 generates a write command under the control of the total control unit 30, and outputs the generated command to the memory cell array 20.

Figure 3:
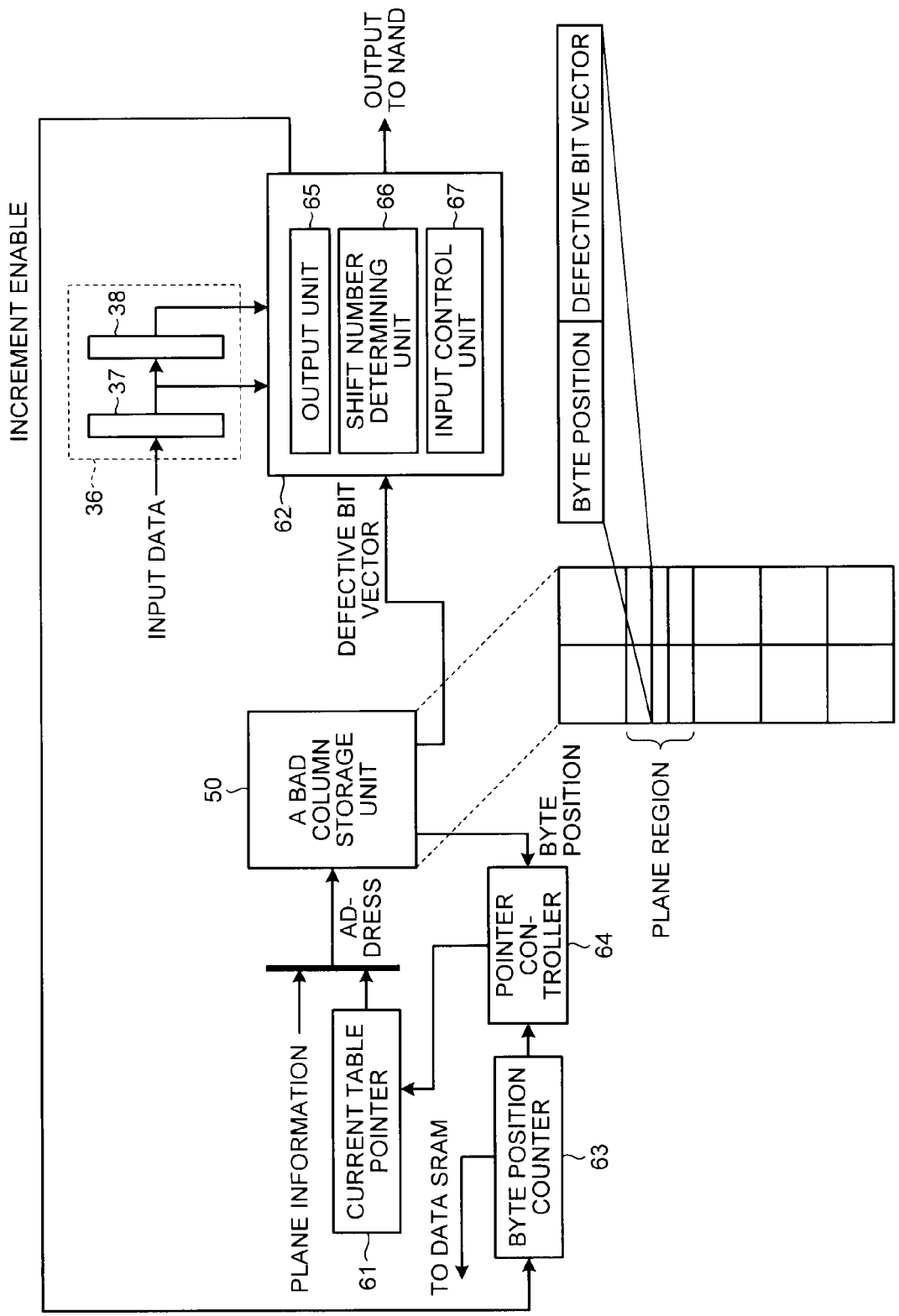
FIG. 3 is a view for describing some detailed functions of the controller according to the embodiment.

FIG. 3 is a view illustrating an example of a detailed configuration of the bad-column storage unit 50 and the write data generating unit 60 shown in FIG. 2. The bad-column storage unit 50 stores byte position (identification information) for identifying a sector and a defective bit vector indicating the presence of a defect of the data line 22 belonging to the sector identified on the byte position, for each plane, wherein the byte position and the defective bit vector are associated with each other. For example, the x-th ($1 \leq x \leq 8$) sector counting from the left side in each plane (page) can be represented as the byte position "x". In this case, the first sector counting from the left side is represented as the byte position "1", and the second sector counting from the left side is represented by the byte position "2". The case where the defective bit vector is represented by "10000000", for example, means that the first data line 22 counted from the left side of the eight data lines 22, belonging to this sector, has a defect, and the second to eighth data lines 22 have no defect. The bad-column storage unit 50 can store all sectors and the defective bit vectors while each defective bit vector is associated with a corresponding sector. The bad-column storage unit 50 can also be configured not to store the byte position identifying the sector to which the defective data line 22 does not belong and the defective bit vector while being associated with each other. In this case, the data region of the bad-column storage unit 50 can advantageously be compressed.

The write data generating unit 60 shown in FIG. 2 includes a current table pointer 61, a generating unit 62, a byte position counter 63, and a pointer controller 64, as shown in FIG. 3. The data region of the bad-column storage unit 50 is divided into regions by each plane (hereinafter referred to as a plane region). Each plane region is configured to include predetermined number of entries. Each plane region is identified by plane information that can specify the corresponding plane region. An entry position in each plane region is designated by the current table pointer 61. Specifically, the plane information and the current table pointer 61 function as address information for designating a specific entry of the bad-column storage unit 50. When the write data is generated, the address information designating the entry with which the byte position indicating the sector to which the write data is supplied and the defective bit vector are registered are generated. The defective bit vector registered with the entry designated by the address information is supplied to the generating unit 62, and the byte position registered with the entry is supplied to the pointer controller 64.

The generating unit 62 includes an output unit 65, a shift number determining unit 66, and an input control unit 67. The shift number determining unit 66 determines a shift number indicating a value corresponding to the number of the defective data lines 22. When generating the write data supplied to each sector, the output unit 65 outputs, based upon the defective bit vector corresponding to the byte position (identification information) of the sector, the write data to be supplied to the sector. Specifically, the output unit 65 outputs the following write data on the basis of the defective bit vector corresponding to the byte position (identification information) of the sector to which the write data is to be supplied. As the write data to be supplied to the defect-free data line 22 in the sector, the output unit 65 outputs the data stored in the respective storage regions one by one starting from the storage region which is after the head storage region by the determined shift number in the sixteen storage regions forming the output FIFO unit 36. In contrast, as the write data to be supplied to the defective data line 22 in the sector, the output unit 65 outputs "1" indicative of a defective bit (information that differs from the data stored in the storage regions). The input control unit 67 controls the input/output unit 32 in order that, every time the number of the storage regions to which data has already been outputted becomes a predetermined number (here, 8) or more, the bytewise data is inputted to the output FIFO unit 36. In the present embodiment, every time the number of the storage regions to which data has already been outputted becomes eight or more, the input control unit 67 outputs an increment enable, which is set to "1", to the byte position counter 63, while outputs an increment enable, which is set to "0", to the byte position counter 63, when the number of the storage regions to which data has already been outputted is less than 8.

The byte position counter 63 increments a count value by one, every time the increment enable set to "1" is supplied from the generating unit 62. Every time the count value is incremented by one, the data of one byte is supplied to the output FIFO unit 36 from the write buffer memory 34.

When the byte position read from the bad-column storage unit 50 and the count value of the byte position counter 63 agree with each other, the pointer controller 64 sets a match flag with the pointer position of the current table pointer 61 unchanged. When the byte position read from the bad-column storage unit 50 is smaller than the count value of the byte position counter 63, the pointer controller 64 resets the match flag with the pointer position of the current table pointer 61 unchanged. When the byte position read from the bad-column storage unit 50 is larger than the count value of the byte position counter 63, the pointer controller 64 increments the pointer position of the current table pointer 61 by one (designates the next entry), and resets the match flag.

Figure 4:
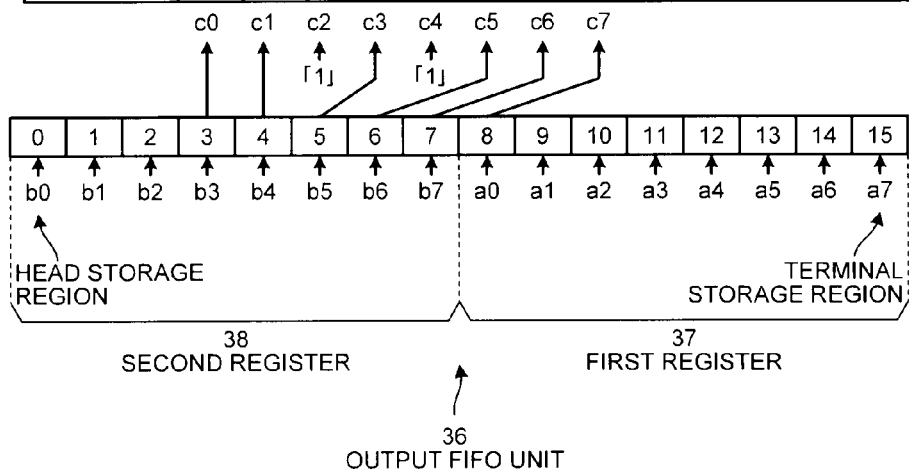
FIG. 4 is a view for specifically describing a function of a generating unit according to the embodiment.

Next, the function of the generating unit 62 will specifically be described. FIG. 4 is a conceptual view for specifically describing the function of the generating unit 62. In the output FIFO unit 36, the 8-bit first register 37 and the 8-bit second register 38 are connected in a two-stage manner. As an example, the storage region corresponding to the bit of the most significant digit of the 8-bit data that the second register 38 can store is "b0", and the "b0" is referred to as the head storage region. Furthermore, in the example, the storage region corresponding to the bit of the least significant digit of the 8-bit data that the first register 37 can store is "a7", and the "a7" is referred to as the terminal storage region. It is supposed here that the defective bit vector corresponding to the sector to which the write data, which is to be generated, is supplied, is "00101000", and the shift number in this process is "3". The 8-bit data (c0 to c7) forming the write data respectively correspond to each of eight data lines 22 belonging to the sector to which the write data is supplied. For example, the first bit data c0 of the write data is the data (the data supplied to the first data line 22) corresponding to the first data line 22. The second bit data c1 is the data corresponding to the second data line 22. The third bit data c2 is the data corresponding to the third data line 22. The fourth bit data c3 is the data corresponding to the fourth data line 22. The fifth bit data c4 is the data corresponding to the fifth data line 22. The sixth bit data c5 is the data corresponding to the sixth data line 22. The seventh bit data c6 is the data corresponding to the seventh data line 22. The eighth bit data c7 is the data corresponding to the eighth data line 22.

As described above, when the write data to be supplied to each sector is generated, the following write data is output. As the write data to be supplied to the defect-free data line 22 in the sector, the data stored in the respective storage regions is outputted one by one starting from the storage region, which is after the head storage region ("b0") by the determined shift number. In contrast, as the write data supplied to the defective data line 22 in the sector, the information indicative of the defective bit ("1" in this example) is outputted. The case in which the defective bit vector is "00101000" means that the first data line 22 corresponding to the c0 does not have a defect. The shift number in this process is "3". Therefore, the data of "3" stored in the storage region b3, which is after the head storage region b0 by three, is outputted as the data c0 corresponding to the first data line 22. Since the second data line 22 corresponding to the c1 does not have a defect, the data of "4" stored in the storage region b4, which is after the head storage region b0 by four, is outputted as the data c1 corresponding to the second data line 22. Since the third data line 22 corresponding to the c2 has a defect, the data of "1" indicating the defective bit is outputted as the data c2 corresponding to the third data line 22. Since the fourth data line 22 corresponding to the c3 does not have a defect, the data of "5" stored in the storage region b5, which is after the head storage region b0 by five, is outputted as the data c3 corresponding to the fourth data line 22.

Since the fifth data line 22 corresponding to the c4 has a defect, the data of "1" indicating the defective bit is outputted as the data c4 corresponding to the fifth data line 22. Since the sixth data line 22 corresponding to the c5 does not have a defect, the data of "6" stored in the storage region b6, which is after the head storage region b0 by six, is outputted as the data c5 corresponding to the sixth data line 22. Since the seventh data line 22 corresponding to the c6 does not have a defect, the data of "7" stored in the storage region b7, which is after the head storage region b0 by seven, is outputted as the data c6 corresponding to the seventh data line 22. Since the eighth data line 22 corresponding to the c7 does not have a defect, the data of "8" stored in the storage region a0, which is after the head storage region b0 by eight, is outputted as the data c7 corresponding to the eighth data line 22. As described above, the write data is generated, and outputted to the buffer 23.

In FIG. 4, the data ("3" to "8") stored in each of the storage regions b3 to a0 are outputted, and therefore, each of the storage regions b3 to a0 becomes the storage region from which the data has already been outputted (the storage region not storing the data). As explained above, the shift number in this case is "3". As such, the data stored in the respective storage regions, i.e., from the head storage region b0 to the storage region b2, has been outputted during the previous generation of the write data. Therefore, the storage regions from the head storage region b0 through the storage region b2 are the storage regions from which the data has already been outputted. Accordingly, the storage regions from the head storage region b0 to the ninth storage region a0 become the storage regions from which the data has already been outputted, whereby the number of the storage regions from which the data has already been outputted is "9". This means that the number of the storage regions from which the data has already been outputted is "8" or more. As such, all of the input data can be stored in the output FIFO unit 36, even if data of one byte is inputted to the output FIFO unit 36 during the generation of next write data. Accordingly, the increment enable is set to be "1", and the data of one byte is inputted to the output FIFO unit 36 during the generation of the next write data.

When the data of one byte is inputted to the output FIFO unit 36 during the generation of the next write data, the data stored in the storage regions a1 to a7 move to the storage regions toward the head by 8. Therefore, during the generation of the next write data, the data is outputted one by one from the storage region b1, which is after the head storage region b0 by one. That is, the shift number in next process is set to be "1". In the present embodiment, the shift number determining unit 66 determines the shift number for the generation of the next write data according to the number of the storage regions from which the data has already been outputted, every time the output unit 65 outputs the write data. More specifically, the shift number determining unit 66 determines the value obtained by subtracting "8", which is the bit number of one byte, from the number of the storage regions from which the data has already been outputted as the shift number in next process, when the number of the storage regions from which the data has already been outputted is eight or more. On the other hand, when the number of the storage regions from which the data has already been outputted is less than eight, this number of the storage regions from which the data has already been outputted is determined as the shift number in next process. When the number of the storage regions from which the data has already been outputted is "9", the shift number in next process is set to be "1" as described above.

Next, the case in which the defective bit vector corresponding to the sector to which the write data, which is to be generated, is supplied is "11111111", and the shift number in this process is "0" will be described with reference to FIG. 5. In this case, the first data line 22 corresponding to the c0 has a defect. Since the shift number in this process is "0", the data "1" indicating the defective bit is outputted as the data c0 corresponding to the first data line 22. Since the second data line 22 corresponding to the c1 has a defect, the data "1" indicating the defective bit is outputted as the data c1 corresponding to the second data line 22. Since the third data line 22 corresponding to the c2 has a defect, the data of "1" indicating the defective bit is outputted as the data c2 corresponding to the third data line 22. Since the fourth data line 22 corresponding to the c3 has a defect, the data of "1" indicating the defective bit is outputted as the data c3 corresponding to the fourth data line 22. Since the fifth data line 22 corresponding to the c4 has a defect, the data of "1" indicating the defective bit is outputted as the data c4 corresponding to the fifth data line 22. Since the sixth data line 22 corresponding to the c5 has a defect, the data of "1" indicating the defective bit is outputted as the data c5 corresponding to the sixth data line 22. Since the seventh data line 22 corresponding to the c6 has a defect, the data of "1" indicating the defective bit is outputted as the data c6 corresponding to the seventh data line 22. Since the eighth data line 22 corresponding to the c7 has a defect, the data of "1" indicating the defective bit is outputted as the data c7 corresponding to the eighth data line 22. In this manner, the write data is generated.

Figure 5:
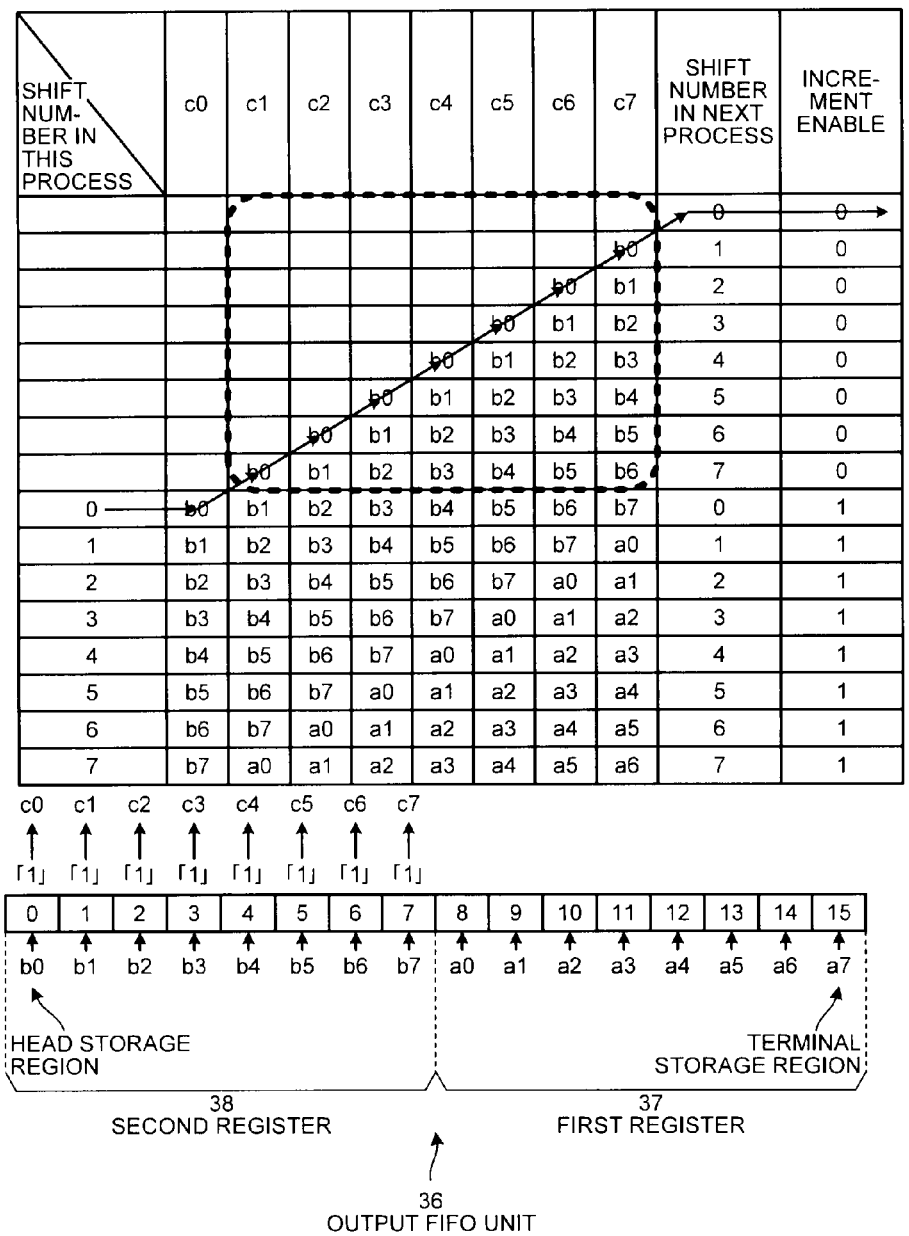
FIG. 5 is a view for specifically describing a function of the generating unit according to the embodiment.

In FIG. 5, none of the data stored in the respective storage regions from the storage region b0 to the storage region a7 is outputted, whereby the number of the storage regions from which the data has already been outputted becomes "0". Since the number of the storage regions from which the data has already been outputted is less than "8", the data of one byte cannot be inputted to the output FIFO unit 36 during the generation of the next write data. Accordingly, the increment enable is set to be "0". Thereby, the data of one byte is not inputted to the output FIFO unit 36, when the next write data is generated. As described above, when the number of the storage regions from which the data has already been outputted is less than eight (in this case, "0"), the number of the storage regions from which the data has already been outputted is determined as the shift number in next process. In this case, the number of the storage regions from which the data has already been outputted is "0", so that the shift number in next process is determined as "0".

Figure 6:
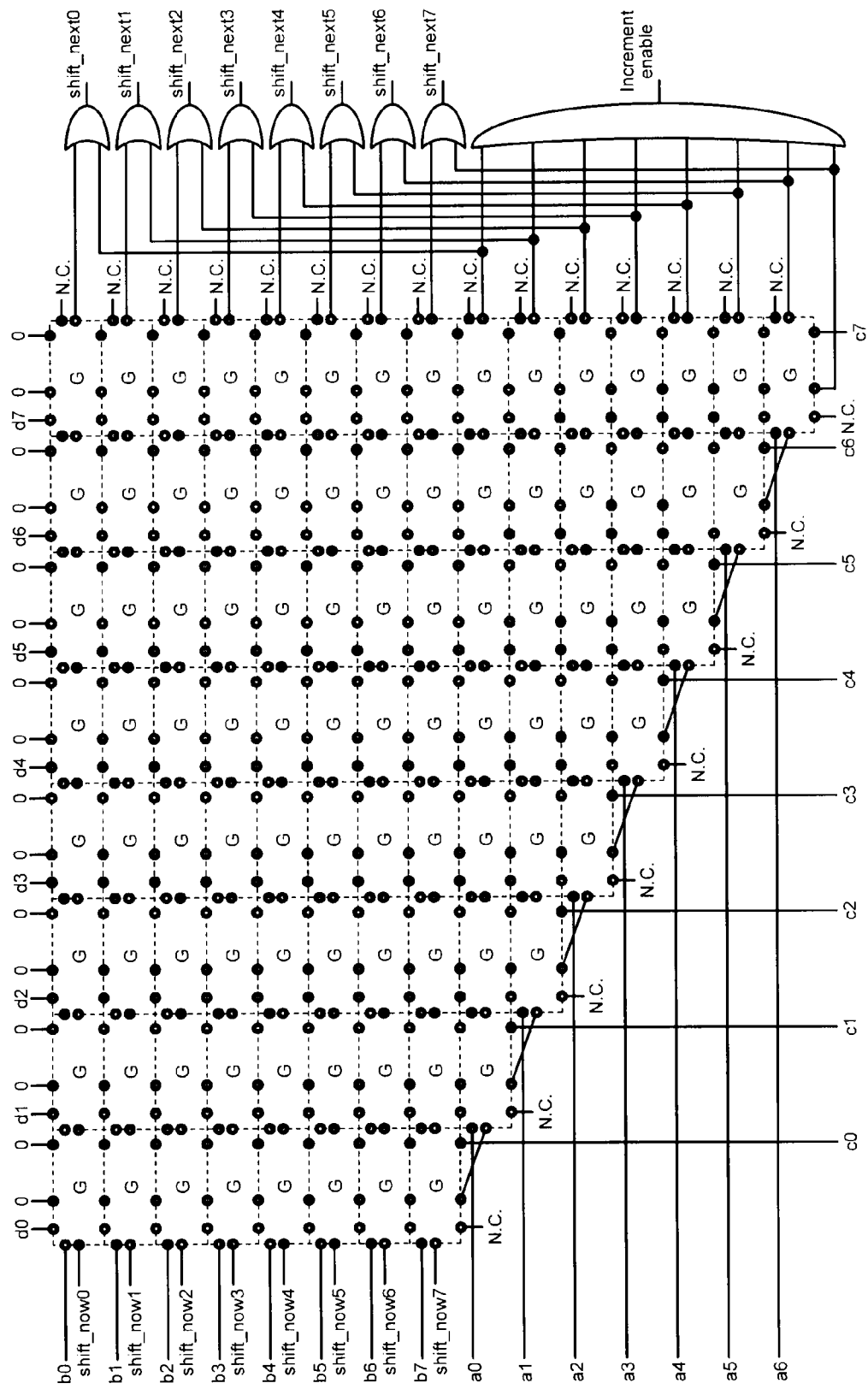
FIG. 6 is a view showing one example of a specific configuration of the generating unit according to the embodiment.
Figure 7:
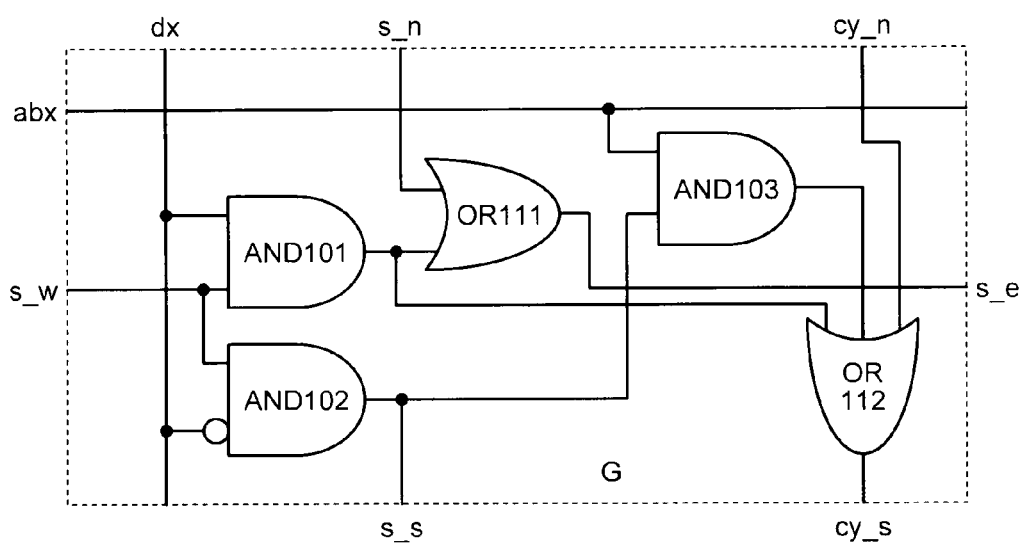
FIG. 7 is a view showing one example of the specific configuration of the generating unit according to the embodiment.

FIGS. 6 and 7 are views illustrating an example of a specific configuration of the generating unit 62. As illustrated in FIG. 6, the generating unit 62 is constructed by combining plural circuits G illustrated in FIG. 7. The data stored in the respective storage regions forming the output FIFO unit 36, a signal shift_now indicating the shift number in this process, and signals d0 to d7 indicating the defective bit vector are inputted to the generating unit 62, and the write data c0 to c7, a signal shift next indicating the shift number in next process, and the increment enable are generated (outputted). For example, when the shift number in this process is "x" (0≤x≤7), the signal shift_nowx is set as an active level (here, a high level as one example). When the x-th data line 22 corresponding to the cx is defective, the signal dx is set as an active level (here, a high level as one example). When the shift number in next process is "x", the generated signal shift_nextx is set as the active level (here, the high level as one example).

The example of the structure of the circuit G will be described, taking the circuit G arranged at the upper left end in FIG. 6 as one example. The structures of the other circuits G are the same. As illustrated in FIG. 7, the circuit G includes an AND circuit 101, an AND circuit 102, an AND circuit 103, an OR circuit 111, and an OR circuit 112. The signal d0 and the signal shift_now0 (corresponding to s_w in FIG. 7) are inputted to the AND circuit 101. The signal shift_now0 (corresponding to s_w in FIG. 7) and a signal formed by inverting the signal d0 are inputted to the AND circuit 102. The output from the AND circuit 102 is inputted to the OR circuit 111 at the circuit G in the lower stage (corresponding to s_s in FIG. 7), and inputted to the AND circuit 103. The output from the AND circuit 101 is inputted to the OR circuit 111 and to the OR circuit 112. The output (corresponding to s_e in FIG. 7) from the OR circuit 111 is inputted (corresponding to s_w in FIG. 7) to the AND circuit 101 and the AND circuit 102 in the circuit G on its right stage. The data stored in the storage region b0 is inputted to the AND circuit 103, and the output from the AND circuit 103 is inputted to the OR circuit 112. The output (corresponding to cy_s in FIG. 7) from the OR circuit 112 is inputted (corresponding to cy n in FIG. 7) to the OR circuit 112 in the circuit G below.

Figure 8:
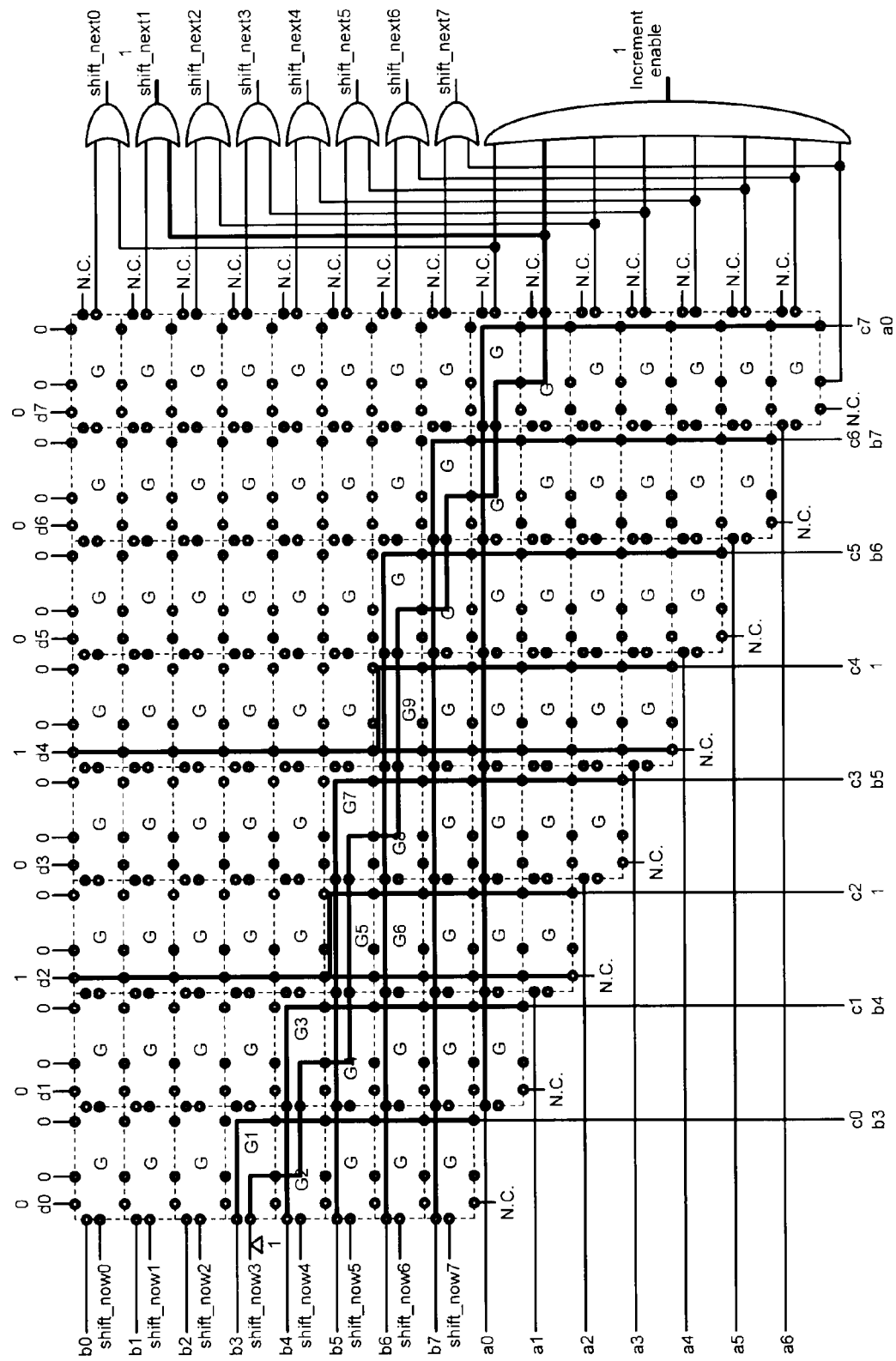
FIG. 8 is a view for describing an example of an operation of the generating unit according to the embodiment.

The example of the operation of the generating unit 62 upon generating the write data illustrated in FIG. 4 will be described with reference to FIG. 8. In this case, the shift number in this process is "3", so that the signal shift_now3 is set as the high level. Since the defective bit vector is "00101000", there is no defect in the first data line 22 corresponding to the c0. Accordingly, the signal d0 is set as "0" indicating the non-active level. As for the circuit G1 to which the signal shift_now3 and the data stored in the storage region b3 are inputted, the signal d0 is set as a low level. Therefore, the output from the AND circuit 102 is changed to the high level. The output from the AND circuit 102 changed to the high level is inputted to the AND circuit 103. When the data stored in the storage region b3 is "1", the output from the AND circuit 103 is changed to the high level. Therefore, the output (corresponding to cy_s in FIG. 7) from the OR circuit 112 is also changed to the high level, and then, inputted (corresponding to cy_n in FIG. 7) to the OR circuit 112 in the circuit G2 below. When the output from the OR circuit 112 is changed to the high level, this output passes through all of the circuits G arranged below. Since the output from the OR circuit 112 in the lowermost circuit G of the column (the first column) to which the circuits G1 and G2 belong becomes the data c0 corresponding to the first data line 22, the data stored in the storage region b3 is outputted as the data c0 corresponding to the first data line 22.

In the circuit G1, the output (corresponding to s_s in FIG. 7), which is changed to the high level, from the AND circuit 102 is inputted (corresponding to s_n in FIG. 7) to the OR circuit 111 in the circuit G2 below. Thereby, the output from the OR circuit 111 in the circuit G2 that is below the circuit G1 is changed to the high level, and this output is inputted to the AND circuit 101 and the AND circuit 102 in the next circuit G3 to the right. Since there is no defect in the second data line 22 corresponding to the c1, the signal d1 is set as "0". Accordingly, the output from the AND circuit 102 in the circuit G3 is changed to the high level, and this output is inputted to the AND circuit 103. When the data stored in the storage region b4 is "1", the output from the AND circuit 103 is changed to the high level. Therefore, the output from the OR circuit 112 is also changed to the high level, and then, inputted to the OR circuit 112 in the circuit G4 below. Since the output from the OR circuit 112 in the lowermost circuit G of the column (the second column) to which the circuits G3 and G4 belong becomes the data c1 corresponding to the second data line 22, the data stored in the storage region b4 is outputted as the data c1 corresponding to the second data line 22.

In the circuit G3, the output, which is changed to the high level, from the AND circuit 102 is inputted (corresponding to s_n in FIG. 7) to the OR circuit 111 in the circuit G4 below. Thereby, the output from the OR circuit 111 in the circuit G4 that is below the circuit G3 is changed to the high level, and this output (corresponding to s_e in FIG. 7) is inputted to the AND circuit 101 and the AND circuit 102 in the next circuit G5 to the right. Since there is a defect in the third data line 22 corresponding to the c2, the signal d2 is set as "1". Accordingly, the output from the AND circuit 101 in the circuit G5 is changed to the high level, whereby the output from the OR circuit 112 is also changed to the high level, and this output is inputted to the OR circuit 112 in the circuit G6 below. Since the output from the OR circuit 112 in the circuit G in the lowermost stage of the column to which the circuits G5 and G6 belong becomes the data c2 corresponding to the third data line 22, the data "1" indicating the defective bit is outputted as the data c2 corresponding to the third data line 22.

Accordingly, the output from the AND circuit 101 in the circuit G5 is changed to the high level, whereby the output from the OR circuit 111 is also changed to the high level, and this high-level signal is inputted to the AND circuit 101 and the AND circuit 102 in the next circuit G7 to the right. Since there is no defect in the fourth data line 22 corresponding to the c3, the signal d3 is set as "0". Accordingly, the output from the AND circuit 102 in the circuit G7 is changed to the high level, and this output is inputted to the AND circuit 103. When the data stored in the storage region b5 is "1", the output from the AND circuit 103 is changed to the high level. Therefore, the output from the OR circuit 112 is also changed to the high level, and then, inputted to the OR circuit 112 in the circuit G8 below. Since the output from the OR circuit 112 in the lowermost circuit G of the column to which the circuits G7 and G8 belong becomes the data c3 corresponding to the fourth data line 22, the data stored in the storage region b5 is outputted as the data c3 corresponding to the fourth data line 22.

Similarly, the data "1" indicating the defective bit is outputted as the data c4 corresponding to the fifth data line 22, the data stored in the storage region b6 is outputted as the data c5 corresponding to the sixth data line 22, the data stored in the storage region b7 is outputted as the data c6 corresponding to the seventh data line 22, and the data stored in the storage region a0 is outputted as the data c7 corresponding to the eighth data line 22. As described above, the write data is generated, and outputted to the buffer 23. In FIG. 8, the signal shift_next1 is set as "1" (high level), and the increment enable is set to be "1".

Figure 9:
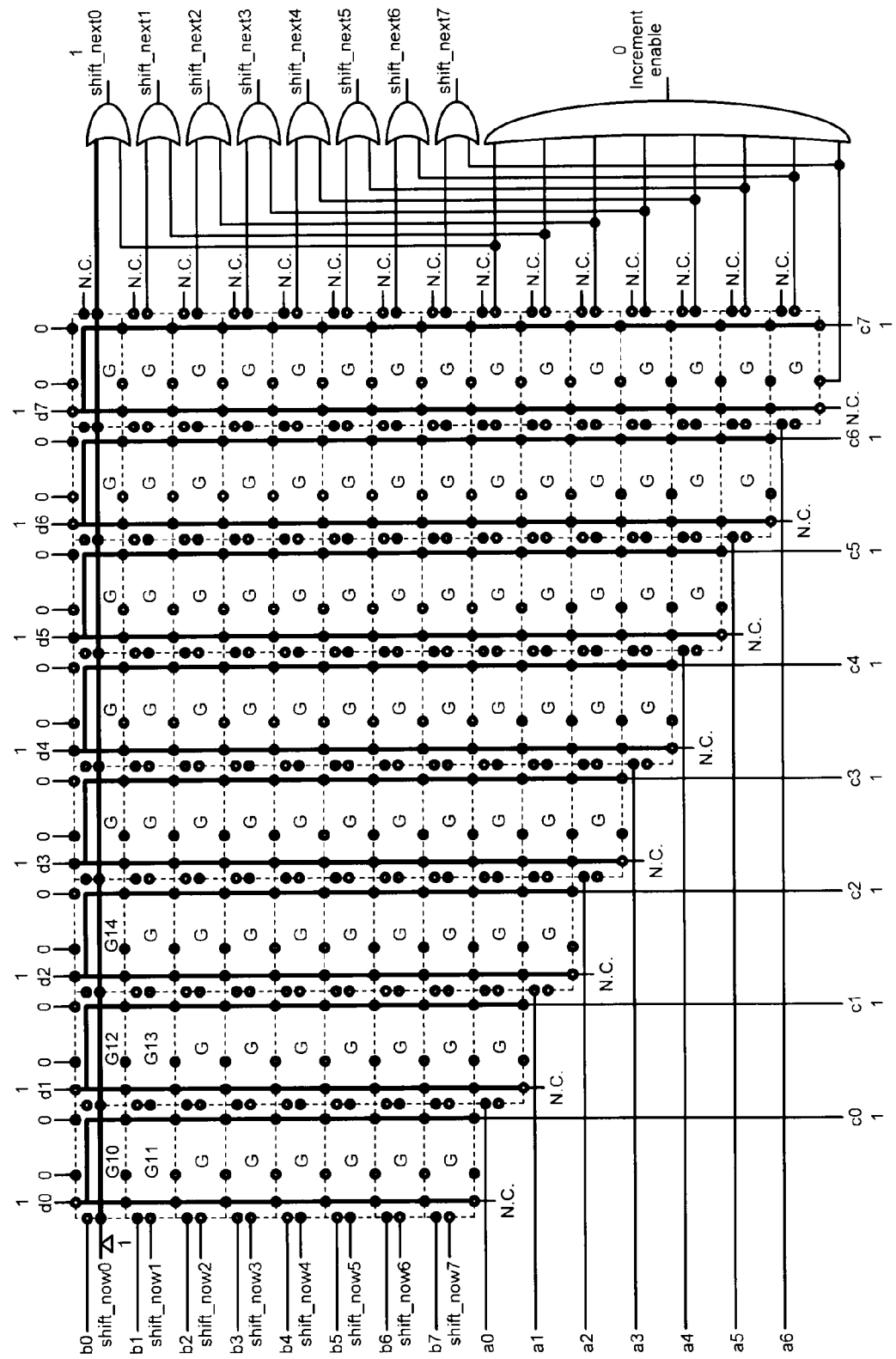
FIG. 9 is a view for describing an example of the operation of the generating unit according to the embodiment.

Next, the example of the operation of the generating unit 62 upon generating the write data illustrated in FIG. 5 will be described with reference to FIG. 9. In this case, the shift number in this process is "0", so that the signal shift_now0 is set as the high level. Since the defective bit vector is "11111111", there is a defect in the first data line 22 corresponding to the c0. Accordingly, the signal d0 is set as the high level. As for the circuit G10 to which the signal shift_now0 and the data stored in the storage region b0 are inputted, the signal d0 is set as the high level, and therefore the output from the AND circuit 101 is changed to the high level. Accordingly, the output from the OR circuit 112 is also changed to the high level, and this output is inputted to the OR circuit 112 in the circuit G11 below. When the output from the OR circuit 112 is changed to the high level, this output passes through all of the circuits G arranged below. Since the output from the OR circuit 112 in the lowermost circuit G of the column to which the circuits G10 and G11 belong becomes the data c0 corresponding to the first data line 22, the data "1" indicating the defective bit is outputted as the data c0 corresponding to the first data line 22.

The output from the AND circuit 101 in the circuit G10 is changed to the high level, whereby the output from the OR circuit 111 is also changed to the high level, and this high-level signal is inputted to the AND circuit 101 and the AND circuit 102 in the next circuit G12 to the right. Since there is a defect in the second data line 22 corresponding to the c2, the signal dl is set as "1". Accordingly, the output from the AND circuit 101 is changed to the high level, and the output from the OR circuit 112 is also changed to the high level. The high-level signal is inputted to the OR circuit 112 in the circuit G13 below. Since the output from the OR circuit 112 in the lowermost circuit G of the column to which the circuits G12 and G13 belong becomes the data c1 corresponding to the second data line 22, the data "1" indicating the defective bit is outputted as the data c1 corresponding to the second data line 22. The output from the AND circuit 101 in the circuit G12 is changed to the high level, whereby the output from the OR circuit 111 is also changed to the high level, and this high-level signal is inputted to the AND circuit 101 and the AND circuit 102 in the next circuit G14 to the right.

Similarly, the data "1" indicating the defective bit is outputted as the data (c2 to c7) corresponding to the third to eighth data lines 22. In this manner, the write data supplied to the sector corresponding to the defective bit vector "11111111" is generated. In FIG. 9, the signal shift_next0 is set as "1" (high level), and the increment enable is set to be "0" (low level).

Generation of Readout Data

Figure 10:
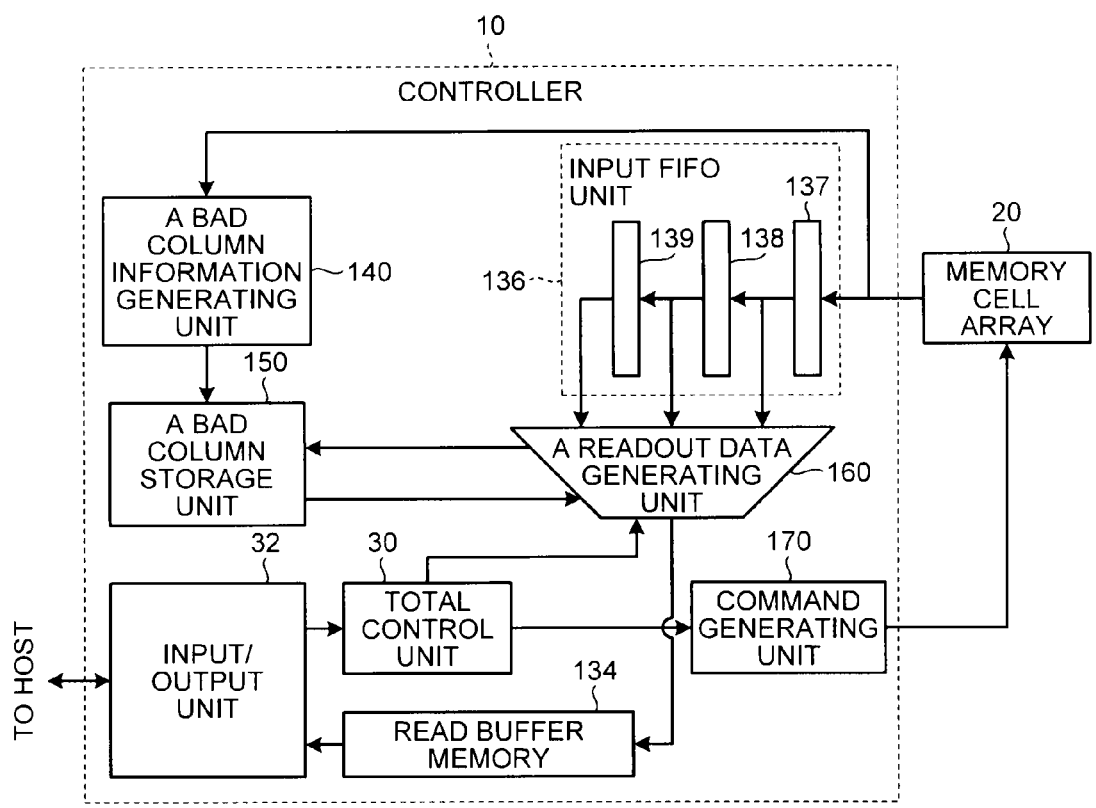
FIG. 10 is a block diagram illustrating the controller according to the embodiment.

The function of the controller 10 for generating readout data will next be described. The controller 10 can be considered as a data generation apparatus that generates readout data. FIG. 10 is a block diagram illustrating an example of a schematic configuration of the controller 10. FIG. 10 mainly illustrates portions necessary for the generation of the readout data, and does not illustrate portions necessary for the generation of write data. As illustrated in FIG. 10, the controller 10 includes the total control unit 30, the input/output unit 32, read buffer memory 134, an input FIFO unit 136, a bad-column information generating unit 140, a bad-column storage unit 150, a readout data generating unit 160, and a command generating unit 170.

Figure 11:
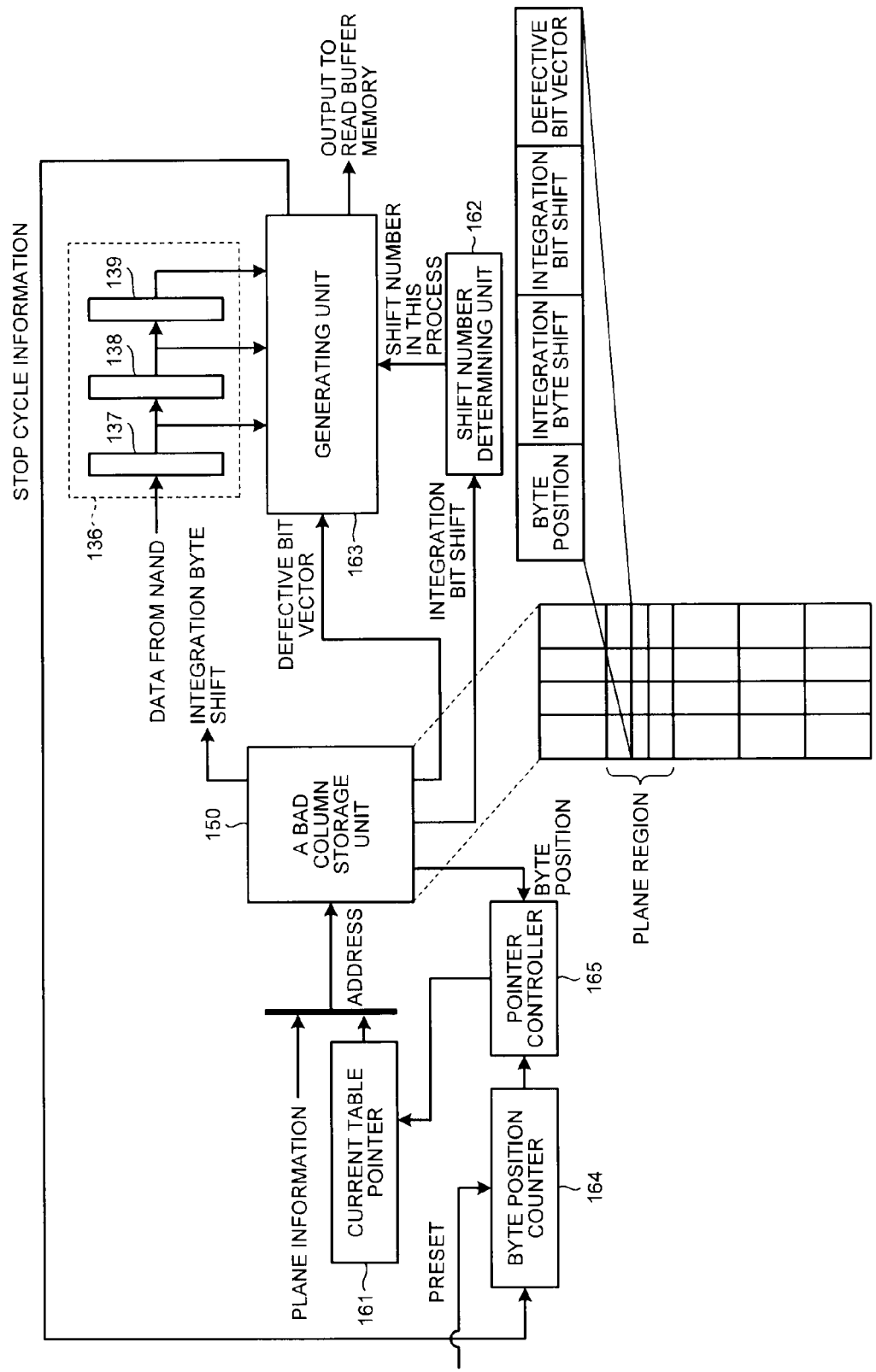
FIG. 11 is a view for describing some detailed functions of the controller according to the embodiment.

The total control unit 30 controls the whole controller 10. The bytewise data is sequentially inputted to the input FIFO unit 136 from the memory cell array 20 (buffer 23). The input FIFO unit 136 in the present embodiment includes an 8-bit third register 137, an 8-bit fourth register 138, and an 8-bit fifth register 139, which are connected in series, as illustrated in FIG. 11. Each of the third register 137, the fourth register 138, and the fifth register 139 includes eight storage regions that can store 1-bit data. In the present embodiment, data is inputted to the input FIFO unit 136 in a unit of eight bits. When receiving the input of the 8-bit data, the input FIFO unit 136 writes the 8-bit data, which has already been stored in the fourth register 138, to the fifth register 139, writes the 8-bit data, which has already been stored in the third register 137, to the fourth register 138, and writes the inputted 8-bit data to the third register 137. Specifically, the data stored in the input FIFO unit 136 is shifted by the eight bits, every time 8-bit data is inputted. From another aspect, it can be considered that the input FIFO unit 136 has 24 storage regions connected in series. In the description below, the storage region corresponding to the bit of the most significant digit out of 8-bit data that can be stored in the fifth register 139 is referred to as a "head storage region", while the storage region corresponding to the bit of the least significant digit out of 8-bit data that can be stored in the third register 137 is referred to as a "terminal storage region", for example. It can also be considered that, when receiving the input of the 8-bit data, the input FIFO unit 136 writes only eight data, which has already been stored in the storage region, to the head storage region, and writes the inputted 8-bit data to each of eight storage regions counting from the terminal.

The bad-column information generating unit 140 detects whether each data line 22 has a defect or not generates bad-column information based on a detection result, and writes the generated bad-column information to the bad-column storage unit 150. The method of generating the bad-column information can be arbitarily. For example, it is determined from a value of a current flowing through each data line 22 whether the data line 22 is defective or not, and the bad-column information can be created by using the result of this determination.

The readout data generating unit 160 generates bytewise readout data sequentially by using twenty-four data stored in the input FIFO unit 136 and the bad-column information stored in the bad-column storage unit 150, and outputs the readout data to the read buffer memory 134. The detail will be described later. The readout data written into the read buffer memory 134 is transmitted to an unillustrated host device via the input/output unit 32. The command generating unit 170 generates a reading command under the control of the total control unit 30, and outputs the generated command to the memory cell array 20. In the present embodiment, the command generating unit 170 controls the memory cell array 20 so as to divide the data, which is outputted from each of plural data lines 22, in byte units (by each sector) under the control of the total control unit 30, and sequentially input the resultant to the input FIFO unit 136.

FIG. 11 is a view illustrating an example of a detailed configuration of the bad-column storage unit 150 and the readout data generating unit 160. The bad-column storage unit 150 stores a byte position for identifying the bytewise readout data, an integration byte shift, an integration bit shift indicating the shift number upon generating the next readout data, and a defective bit vector for specifying the storage region to which the output of the data is skipped during the generation of the readout data indicated by the byte position, those of which are associated with one another. For example, the byte position for identifying the readout data on the x-th byte counted from the head can be represented as "x". In this case, the byte position for identifying the readout data (readout data on the first byte) generated first is represented as "1", and the byte position for identifying the readout data (readout data on the second byte) generated second is represented as "2". The integration byte shift is information indicating the difference between the number of bytewise data sent from the buffer 23 and the number of the bytewise readout data generated so far. The integration byte shift is used for setting (presetting) a counter value of a byte position counter 164, when the readout data is generated halfway through a page. The bad-column storage unit 150 can store data (position of sector, integration byte shift, integration bit shift, defective bit vector) corresponding to each of all readout data. The bad-column storage unit 150 may not store the data (position of sector, integration byte shift, integration bit shift, defective bit vector) corresponding to the readout data, which is generated without skipping the output of the data from the storage region, out of the readout data. In this case, the data region of the bad-column storage unit 150 can advantageously be compressed.

The readout data generating unit 160 includes a current table pointer 161, a shift number determining unit 162, a generating unit 163, a byte position counter 164, and a pointer controller 165. The data region of the bad-column storage unit 150 is divided into regions by each plane (hereinafter referred to as a plane region), and each plane region includes predetermined number of entries. Each plane region is identified by plane information. An entry position in each plane region is designated by the current table pointer 161. Specifically, the plane information and the current table pointer 161 function as address information for designating a specific entry of the bad-column storage unit 150. When the readout data is generated, the address information designating the entry corresponding to the readout data is generated. The integration bit shift registered with the entry designated by the address information is supplied to the shift number determining unit 162, the defective bit vector is supplied to the generating unit 163, and the byte position is supplied to the pointer controller 165.

The shift number determining unit 162 determines the shift number in this process by using the integration bit shift read by the bad-column storage unit 150, and outputs the determined shift number to the generating unit 163. The generating unit 163 sequentially generates the readout data by using the defective bit vector read from the bad-column storage unit 150 and the shift number determined by the shift number determining unit 162. In the present embodiment, the generating unit 163 sequentially outputs eight data, which is stored in the storage region other than the storage region storing the data (i.e., the data indicating the defective bit) outputted from the defective data line 22, counting from the storage region, which is after the head storage region, in twenty-four storage regions forming the input FIFO unit 136, by the determined shift number determined in this process, thereby generating the bytewise (8 bits) readout data. The generating unit 163 also determines a period (cycle number) during when the generation of the readout data is stopped, according to the number of the storage regions from which the output of the data is skipped. In the present embodiment, when the sum of the shift number in this process and the number of the storage regions from which the output of the data is skipped during the generation of the readout data is one or more and less than eight, the generating unit 163 outputs stop cycle information, which indicates that the generation of the readout data is stopped by one cycle, to the byte position counter 164. When the sum of the shift number in this process and the number of the storage regions from which the output of the data is skipped during the generation of the readout data is eight or more, the generating unit 163 outputs stop cycle information, which indicates that the generation of the readout data is stopped by two cycles, to the byte position counter 164.

The byte position counter 164 increments the count value by one, every time the bytewise readout data is generated. When the byte position read from the bad-column storage unit 150 and the count value of the byte position counter 164 agree with each other, the pointer controller 165 sets a match flag with the pointer position of the current table pointer 161 unchanged. When the byte position read from the bad-column storage unit 150 is larger than the count value of the byte position counter 164, the pointer controller 165 resets the match flag with the pointer position of the current table pointer 161 unchanged. When the byte position read from the bad-column storage unit 150 is smaller than the count value of the byte position counter 164, the pointer controller 165 increments the pointer position of the current table pointer 161 by one (designates the next entry), and resets the match flag.

Figure 12:
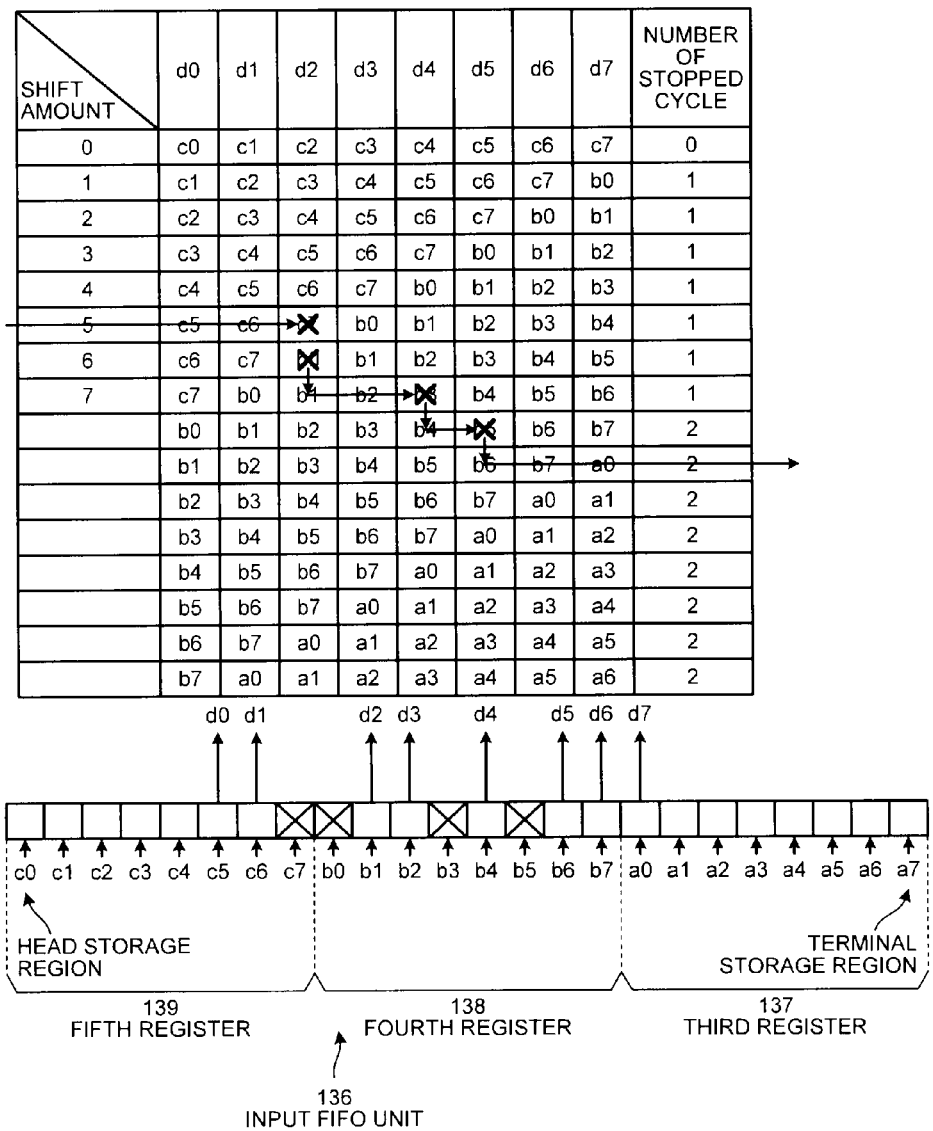
FIG. 12 is a view for specifically describing a function of the generating unit according to the embodiment.

The function of the generating unit 163 will specifically be described next. FIG. 12 is a view for specifically describing a function of the generating unit 163. In the input FIFO unit 136, the 8-bit third register 137, the 8-bit fourth register 138, and the 8-bit fifth register 139 are connected in a three-stage manner. As an example, the storage region corresponding to the bit of the most significant digit of the 8-bit data that the fifth register 139 can store is "c0", and the "c0" is referred to as the head storage region. As one example, the storage region corresponding to the bit of the least significant digit of the 8-bit data that the third register 137 can store is "a7", and the "a7" is referred to as the terminal storage region. It is supposed here that the defective bit vector corresponding to the sector to which the readout data, which is to be generated, is supplied, is "0011001010000000", and the shift number in this process is "5". Each bit data forming the readout data is represented by d0 to d7.

As described above, when generating the bytewise readout data, the generating unit 163 outputs one by one eight data, which is stored in the storage region other than the storage region storing the data outputted from the defective data line 22, from the storage region, which is after the head storage region c0 by the shift number determined in this process, thereby generating the readout data. The shift number in this process is "5". Therefore, the generating unit 163 outputs one by one the data stored in the storage region other than the storage region storing the data outputted from the defective data line 22 from the storage region c5, which is after the head storage region c0 by five, with reference to the defective bit vector "0011001010000000". Each bit data forming the defective bit vector "0011001010000000" corresponds to each of the storage regions c5 to a0, and is set in advance so as to indicate whether or not the data stored in the corresponding storage region is the data outputted from the defective data line 22.

Since the first bit data of the defective bit vector is "0", the data stored in the corresponding storage region c5 is the data outputted from the data line 22 having no defect. Therefore, the data stored in the storage region c5 is outputted as the first bit data d0 of the readout data. Since the second bit data of the defective bit vector is "0", the data stored in the corresponding storage region c6 is outputted as the second bit data d1 of the readout data.

Since the third bit data of the defective bit vector is "1", the data stored in the corresponding storage region c7 is the data outputted from the defective data line 22. Therefore, the data stored in the storage region c7 is not outputted (the output of the data is skipped). Since the fourth bit data of the defective bit vector is "1", the data stored in the corresponding storage region b0 is not outputted (the output of the data is skipped).

Since the fifth bit data of the defective bit vector is "0", the data stored in the corresponding storage region b1 is outputted as the third bit data d2 of the readout data. Since the sixth bit data of the defective bit vector is "0", the data stored in the corresponding storage region b2 is outputted as the fourth bit data d3 of the readout data. Since the seventh bit data of the defective bit vector is "1", the data stored in the corresponding storage region b3 is not outputted. Since the eighth bit data of the defective bit vector is "0", the data stored in the corresponding storage region b4 is outputted as the fifth bit data d2 of the readout data. Since the ninth bit data of the defective bit vector is "1", the data stored in the corresponding storage region b5 is not outputted.

Since the tenth bit data of the defective bit vector is "0", the data stored in the corresponding storage region b6 is outputted as the sixth bit data d5 of the readout data. Since the eleventh bit data of the defective bit vector is "0", the data stored in the corresponding storage region b7 is outputted as the seventh bit data d6 of the readout data. Since the twelfth bit data of the defective bit vector is "0", the data stored in the corresponding storage region a0 is outputted as the eighth bit data d7 of the readout data. The bit data after the thirteenth bit data of the defective bit vector is not involved with the generation of the readout data, so that they are all set to be "0". In this manner, the readout data is generated, and the resultant is outputted to the read buffer memory 134.

In the present embodiment, the integration bit shift in each entry of the bad-column storage unit 150 is set beforehand such that, when the sum of the shift number in this process and the number of the storage regions from which the output of the data is skipped during the generation of the readout data is less than 8, this sum becomes the shift number in this process, and when the sum is eight or more, the value obtained by subtracting eight from the sum becomes the shift number in the next process. For example, the integration bit shift included in the entry is set in advance such that, in case where the shift number in this process is "0", and the number of the storage regions from which the output of the data is skipped during the generation of the readout data is "3" when the readout data corresponding to the byte position included in the predetermined entry is generated, the shift number in the next process becomes "3". In FIG. 12, the shift number in this process is "5", and the number of the storage regions from which the output of the data is skipped during the generation of the readout data is "4", whereby the integration bit shift corresponding to the readout data is set beforehand such that the shift number in this process becomes (5+4)−8=1. In other words, the shift number is set to be variable according to the number of the storage regions from which the output is skipped. In FIG. 12, since the sum of the shift number in this process, and the number of the storage regions from which the output of the data is skipped during the generation of the readout data becomes 9(=5+4) that exceeds "8", the generating unit 163 outputs stop cycle information, which indicates that the generation of the readout data is stopped by two cycles, to the byte position counter 164.

Next, the case in which the defective bit vector corresponding to the readout data, which is to be generated, is "111111110000000", and the shift number in this process is "7" will be described with reference to FIG. 13. The shift number in this process is "7". Therefore, the generating unit 163 outputs one by one only eight data stored in the storage region, other than the storage region storing the data outputted from the defective data line 22, from the storage region c7, which is after the head storage region c0 by seven, with reference to the defective bit vector "111111110000000". As in FIG. 12, each bit data forming the defective bit vector "111111110000000" corresponds to each of the storage regions c7 to a6, and is set in advance so as to indicate whether or not the data stored in the corresponding storage region is the data outputted from the defective data line 22.

Since the first bit data of the defective bit vector is "1", the data stored in the corresponding storage region c7 is the data outputted from the defective data line 22. Therefore, the data stored in the storage region c7 is not outputted (the output of the data is skipped). Similarly, since each of the second to eighth bit vectors of the defective bit vector is "1", the data stored in the corresponding storage regions b0 to b6 is not outputted.

Since the ninth bit data of the defective bit vector is "0", the data stored in the corresponding storage region b7 is the data outputted from the data line 22 having no defect. Therefore, the data stored in the storage region b7 is outputted as the first bit data d0 of the readout data. Similarly, since each of the tenth to fifteenth bit vectors of the defective bit vector is "0", the data stored in the storage regions a0 is outputted as the second bit data d1 of the readout data, the data stored in the storage region a1 is outputted as the third bit data d2 of the readout data, the data stored in the storage region a2 is outputted as the fourth bit data d3 of the readout data, the data stored in the storage region a3 is outputted as the fifth bit data d4 of the readout data, the data stored in the storage region a4 is outputted as the sixth bit data d5 of the readout data, the data stored in the storage region a5 is outputted as the seventh bit data d6 of the readout data, and the data stored in the storage region a6 is outputted as the eighth bit data d7 of the readout data. In this manner, the readout data is generated, and the resultant is outputted to the read buffer memory 134.

Figure 13:
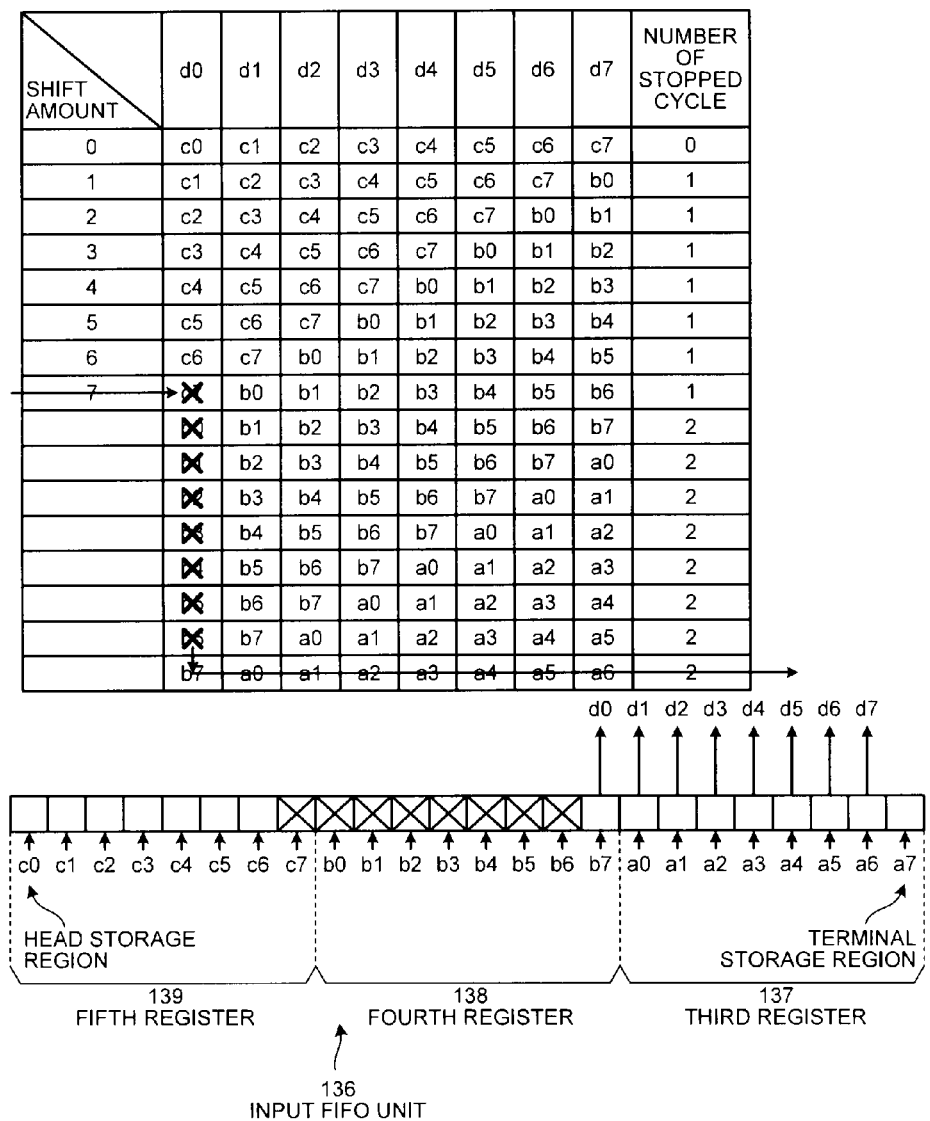
FIG. 13 is a view for specifically describing a function of the generating unit according to the embodiment.

In FIG. 13, since the shift number in this process is "7", and the number of the storage regions from which the output of the data is skipped during the generation of the readout data is "8", the integration bit shift corresponding to the readout data generated in FIG. 13 is set beforehand such that the shift number in this process becomes (7+8)−8=7. Since the sum of the shift number in this process, and the number of the storage regions from which the output of the data is skipped during the generation of the readout data exceeds "8", the generating unit 163 outputs stop cycle information, which indicates that the generation of the readout data is stopped by two cycles, to the byte position counter 164.

Figure 14:
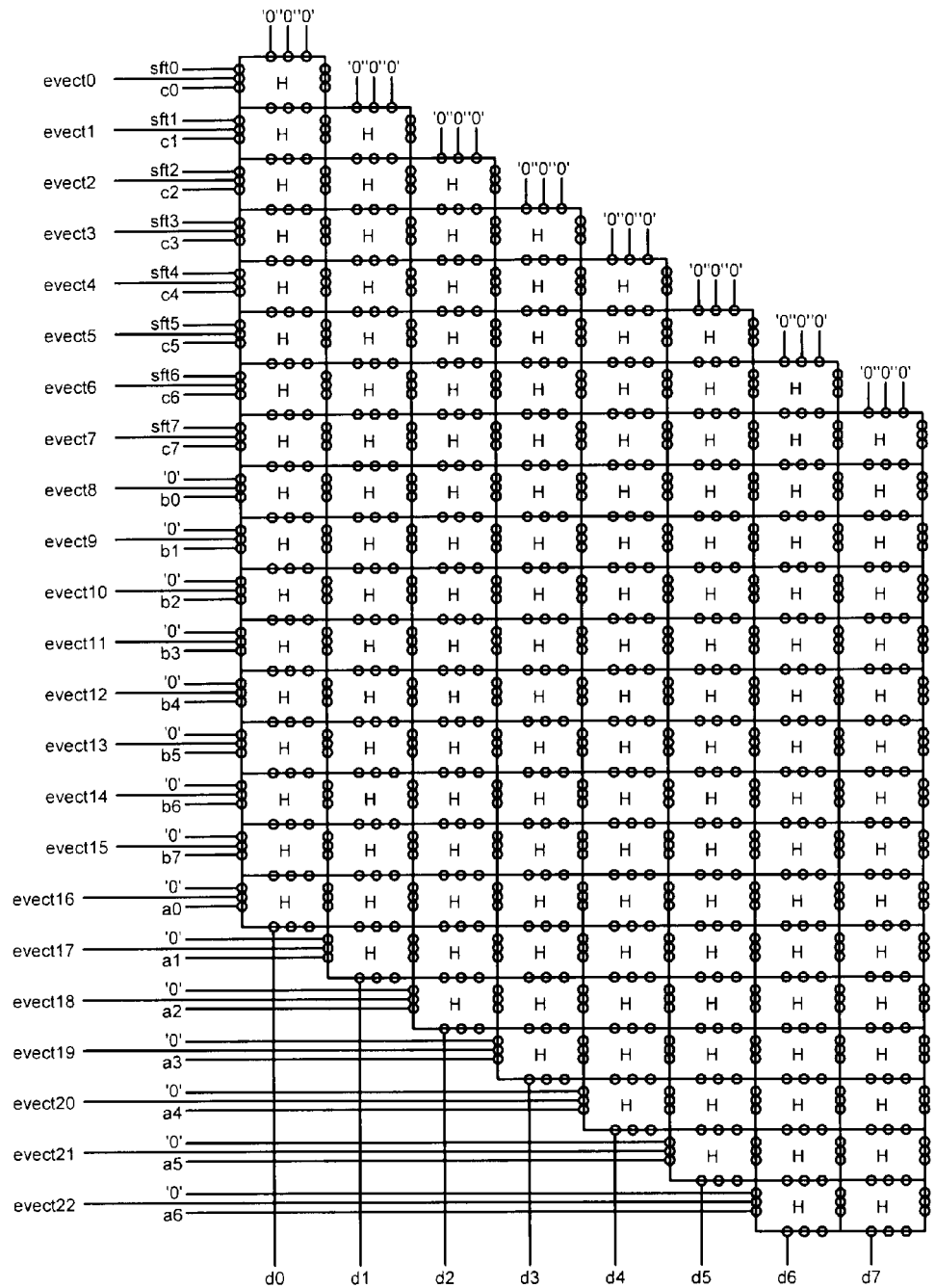
FIG. 14 is a view showing one example of a specific configuration of the generating unit according to the embodiment.
Figure 15:
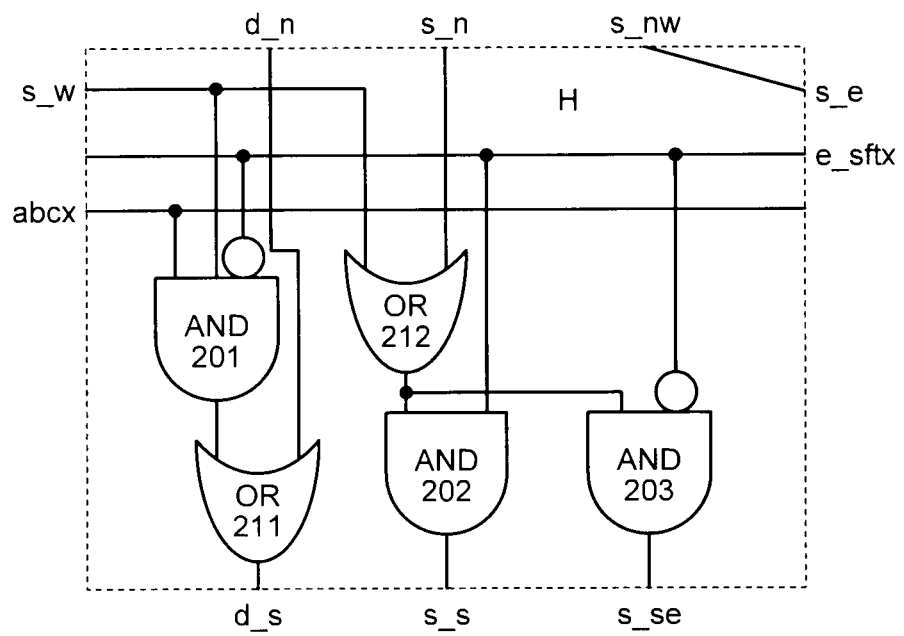
FIG. 15 is a view showing one example of the specific configuration of the generating unit according to the embodiment.

FIGS. 14 and 15 illustrate an example of the specific structure of the generating unit 163. As illustrated in FIG. 14, the generating unit 163 is constructed by combining plural circuits H illustrated in FIG. 15. The data stored in the respective storage regions forming the input FIFO unit 136, a signal sft indicating the shift number in this process, and signal evect obtained by shifting the defective bit vector, corresponding to the readout data to be generated, by the shift number in this process, are inputted to the generating unit 62, and the readout data d0 to d7 are generated (outputted). For example, when the shift number in this process is "x" (0≤x≤7), the signal sftx is set as the high level.

The example of the structure of the circuit H will be described, taking the circuit H arranged at the upper left end in FIG. 14 as one example. The structures of the other circuits H are the same. As illustrated in FIG. 15, the circuit H includes an AND circuit 201, an AND circuit 202, an AND circuit 203, an OR circuit 211, and an OR circuit 212. A signal sft0 (corresponding to s_w in FIG. 15), the data (corresponding to abcx in FIG. 15) stored in the head storage region c0, and the signal formed by inverting a signal evect0 (corresponding to e_sftx in FIG. 15) are inputted to the AND circuit 201. The output from the AND circuit 201 is inputted to the OR circuit 211, and the output (corresponding to d_s in FIG. 15) from the OR circuit 211 is inputted (corresponding to d_n in FIG. 15) to the OR circuit 211 in the circuit H below.

The signal sft0 (corresponding to s_w in FIG. 15) is inputted to the OR circuit 212, and the output from the OR circuit 212 is inputted to the AND circuit 202. The signal evect0 (corresponding to e_sftx in FIG. 15) is inputted to the AND circuit 202, and the output (corresponding to s_s in FIG. 15) from the AND circuit 202 is inputted (corresponding to s_n in FIG. 15) to the OR circuit 212 in the circuit H below. The output from the OR circuit 212 and the signal obtained by inverting the signal evect0 (corresponding to e_sftx in FIG. 15) are inputted to the AND circuit 203. The output (corresponding to s se in FIG. 15) from the AND circuit 203 is inputted (corresponding to s_nw in FIG. 15) to the circuit H below, and then, outputted (corresponding to s_e and s_w in FIG. 15) to the next circuit H to the right.

Figure 16:
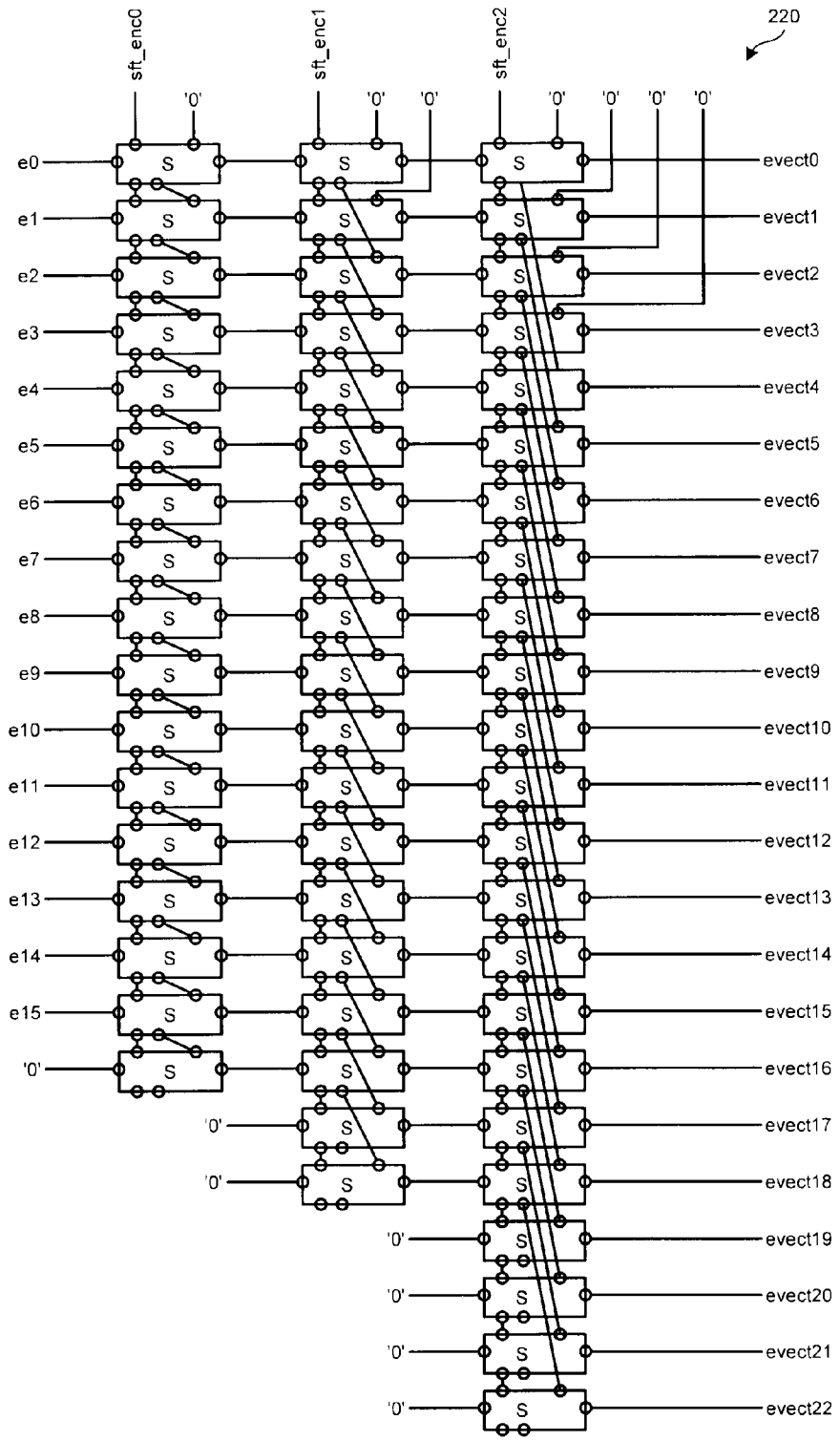
FIG. 16 is a view illustrating an example of a structure of a first circuit unit according to the embodiment.

FIG. 16 is a view illustrating an example of a structure of a first circuit unit 220 that generates the signal evect. The generating unit 163 includes the first circuit unit 220. As illustrated in FIG. 16, the first circuit unit 220 is formed by combining plural circuits S illustrated in FIG. 17. A signal e indicating the defective bit vector, and three signals sft_enc0 to sft_enc2 set according to the shift number in this process are inputted to the first circuit unit 220, whereby the signal evect is generated (outputted).

Figure 17:
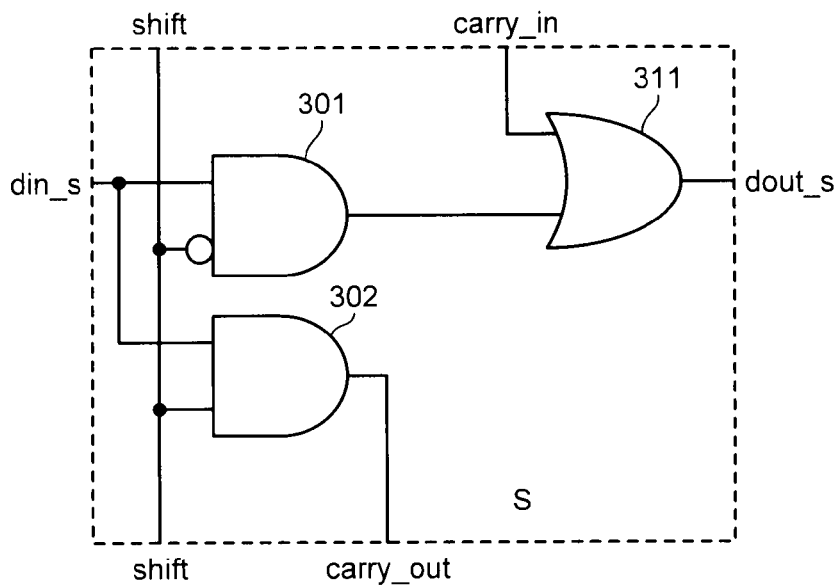
FIG. 17 is a view illustrating an example of the structure of the first circuit unit according to the embodiment.

The example of the structure of a circuit S will be described, taking the circuit S arranged at the upper left end in FIG. 16 as one example. As illustrated in FIG. 17, the circuit S includes an AND circuit 301, an AND circuit 302, and an OR circuit 311. A signal e0 (corresponding to din_s in FIG. 17) indicating the first bit vector of the defective bit vector, and a signal formed by inverting a signal sft_enc0 are inputted to the AND circuit 301. The output from the AND circuit 301 is inputted to the OR circuit 311, and the output (corresponding to dout_s in FIG. 17) from the OR circuit 311 is inputted (corresponding to din_s in FIG. 17) to the AND circuit 301 and the AND circuit 302 in the next circuit S to the right. A signal e0 (corresponding to din_s in FIG. 17) indicating the first bit vector of the defective bit vector, and a signal sft_enc0 are inputted to the AND circuit 302. The output (corresponding to carry out in FIG. 17) from the AND circuit 302 is inputted (corresponding to carry_in in FIG. 17) to the OR circuit 311 in the circuit S that is only one below the corresponding circuit S. In the present embodiment, in the circuit S belonging to the second column, the output from the AND circuit 302 is inputted to the OR circuit in the circuit S that is arranged only two below the corresponding circuit S, and in the circuit S belonging to the last third column, the output from the AND circuit 302 is inputted to the OR circuit in the circuit S that is only four below the corresponding circuit. As described above, the signal sft_enc0 is inputted to the circuit S at the upper left end (the uppermost stage on the first column) in FIG. 16. On the other hand, as illustrated in FIG. 16, the signal sft_enc1 is inputted to the uppermost circuit S on the second column, and the signal sft_enc2 is inputted to the uppermost circuit S on the third column.

Figure 18:
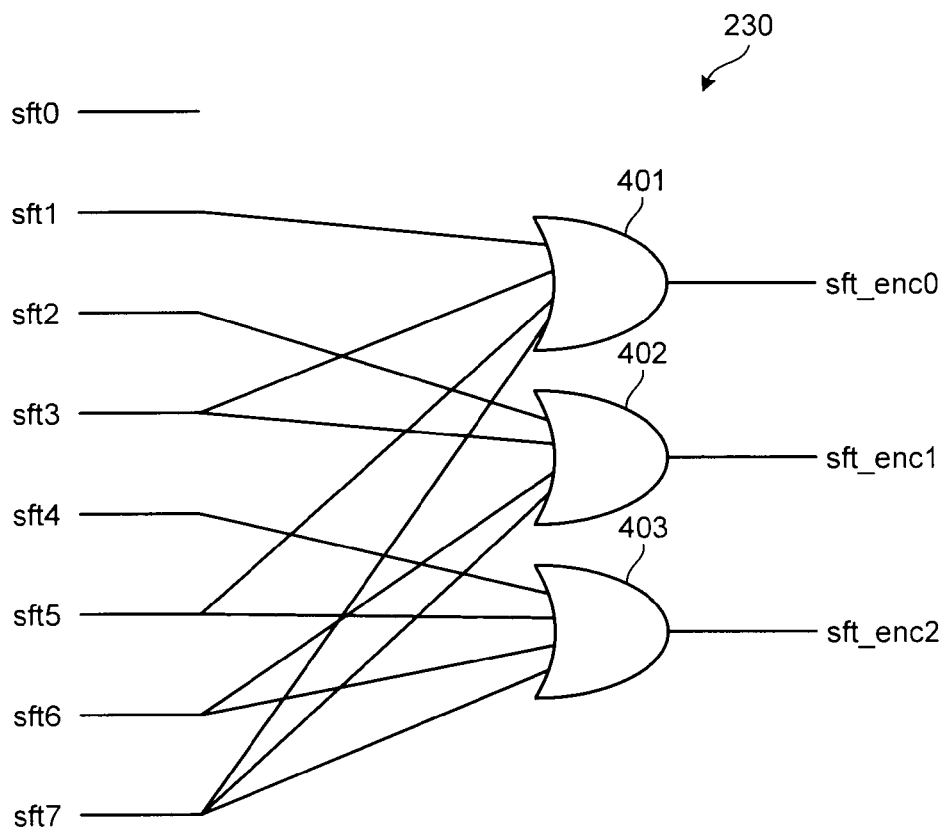
FIG. 18 is a view illustrating an example of a structure of a second circuit unit according to the embodiment.

FIG. 18 is a view illustrating an example of a structure of a second circuit unit 230 that generates signals sft enc0 to sft_enc2. The generating unit 163 includes the second circuit unit 230. As illustrated in FIG. 18, the second circuit unit 230 includes an OR circuit 401, an OR circuit 402, and an OR circuit 403. A signal sft1 indicating the shift number "1", a signal sft3 indicating the shift number "3", a signal sft5 indicating the shift number "5", and a signal sft7 indicating the shift number "7" are inputted to the OR circuit 401. The output from the OR circuit 401 becomes the signal sft_enc0. A signal sft2 indicating the shift number "2", the signal sft3 indicating the shift number "3", a signal sft6 indicating the shift number "6", and the signal sft7 indicating the shift number "7" are inputted to the OR circuit 402. The output from the OR circuit 402 becomes the signal sft_enc1. A signal sft4 indicating the shift number "4", the signal sft5 indicating the shift number "5", a signal sft6 indicating the shift number "6", and the signal sft7 indicating the shift number "7" are inputted to the OR circuit 403. The output from the OR circuit 403 becomes the signal sft_enc2.

Figure 19:
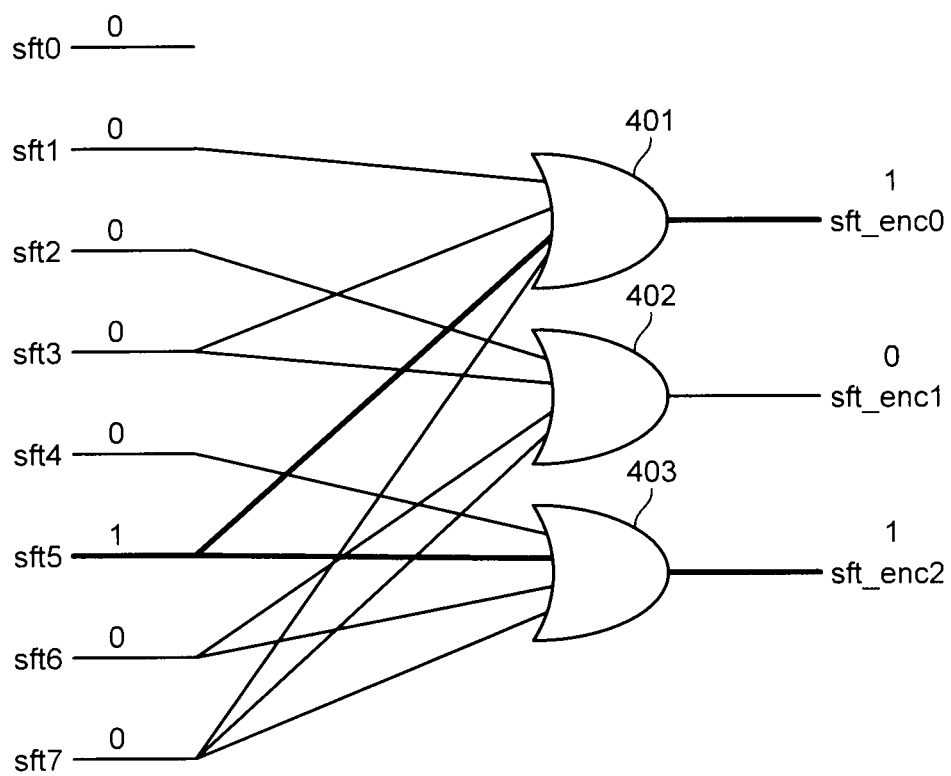
FIG. 19 is a view for describing an example of an operation of the generating unit according to the embodiment.
Figure 20:
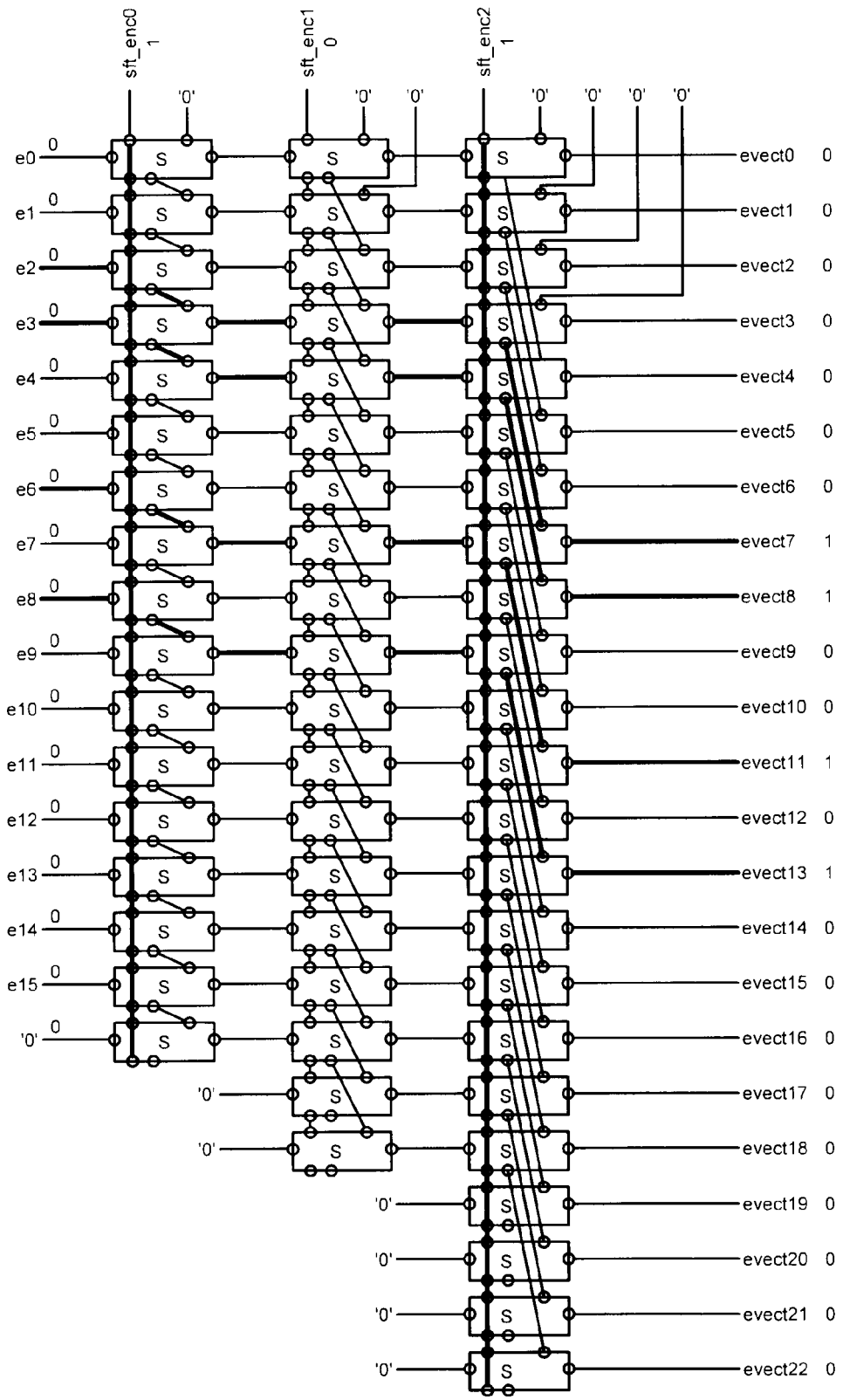
FIG. 20 is a view for describing an example of the operation of the generating unit according to the embodiment.

An example of the operation of the generating unit 163 upon generating the readout data illustrated in FIG. 12 will next be described. In this case, the shift number in this process is "5", so that the signal sft5 is set as the high level. Therefore, as illustrated in FIG. 19, the output from the OR circuit 401 is changed to the high level, the output from the OR circuit 402 is changed to the low level, and the output from the OR circuit 403 is changed to the high level. Specifically, the signal sft_enc0 is changed to the high level, the signal sft_enc1 is changed to the low level, and the signal sft_enc2 is changed to the high level. Since the defective bit vector is "0011001010000000", the signals evect0 to evect22 generated in the first circuit unit 220 become as illustrated in FIG. 20.

Figure 21:
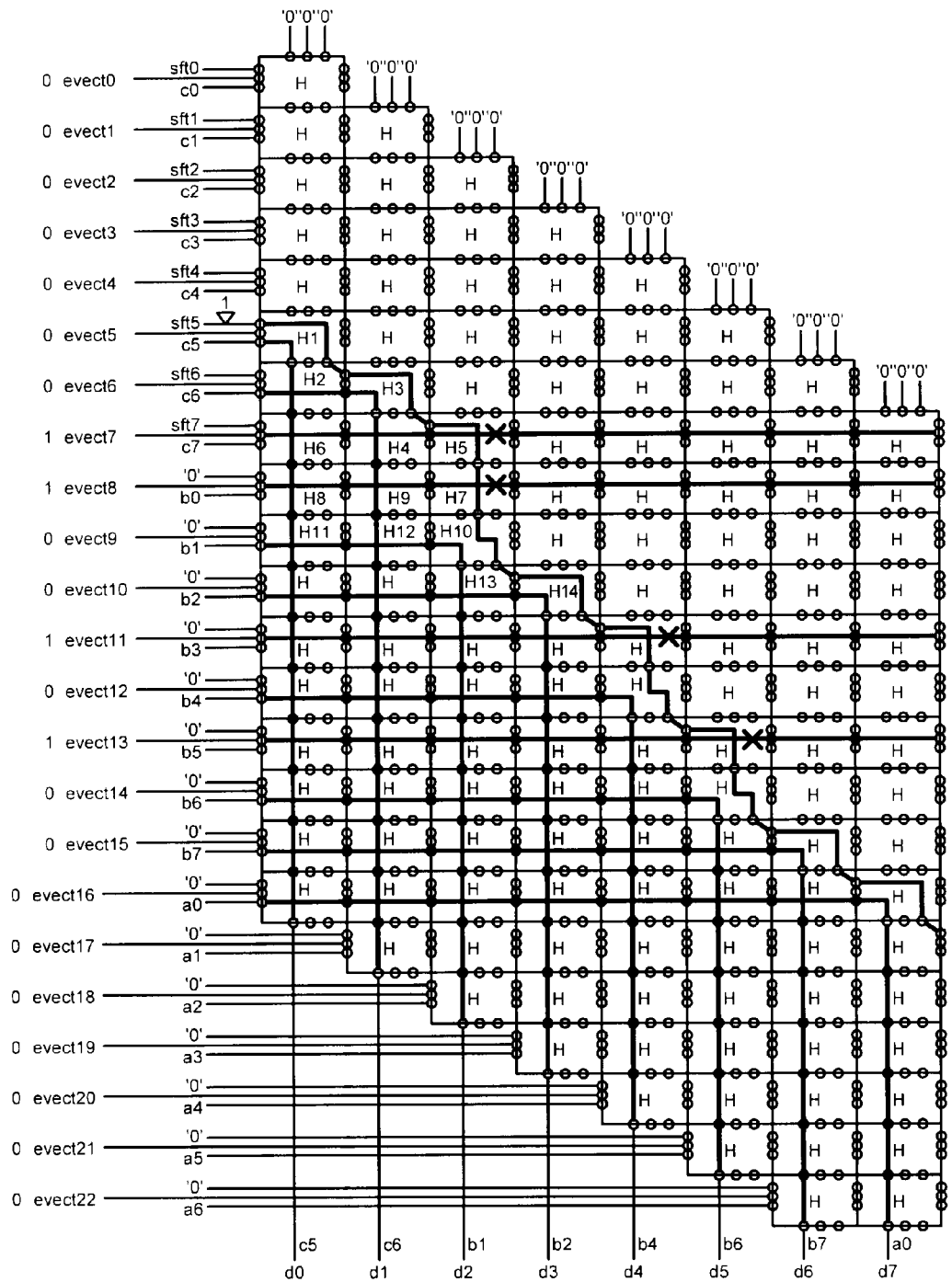
FIG. 21 is a view for describing an example of the operation of the generating unit according to the embodiment.

In FIG. 21, as for the circuit H1 to which the signal sft5 indicating the shift number 5, the signal evect5, and the data stored in the storage region c5 are inputted, the signal sft5 is at the high level, and the signal evect5 is at the low level. Therefore, when the data stored in the storage region c5 is "1", the output from the AND circuit 201 is changed to the high level. Thereby, the output from the OR circuit 211 is changed to the high level, and this high-level signal is inputted to the OR circuit 211 in the circuit H2 below. When the output from the OR circuit 211 is changed to the high level, this output passes through all of the circuits H arranged below. Since the output from the OR circuit 211 in the lowermost circuit H of the column (the first column) to which the circuits H1 and H2 belong becomes the first bit data d0 of the readout data, the data stored in the storage region c5 is outputted as the first bit data d0.

The output from the OR circuit 212 in the circuit H1 is also changed to the high level, so that the output from the AND circuit 203 is also changed to the high level. This high-level signal is inputted to the circuit H2 below, and then, inputted (corresponding to s_w in FIG. 15) to the circuit H3 to the right of the circuit H2.

As for the circuit H2 to which the signal sft6 indicating the shift number 6, the signal evect6, and the data stored in the storage region c6 are inputted, the signal sft6 and the signal evect6 are at the low level. Therefore, the outputs from the AND circuits 201, 202, and 203 are changed to the low level. The low-level signal evect6 is inputted (corresponding to e_sftx in FIG. 15) to the next circuit H3 to the right as unchanged. When the data stored in the storage region c6 is "1", the high-level signal abcx is inputted to the circuit H3. As described above, the high-level signal (corresponding to s_nw in FIG. 15) inputted from the circuit H1 is inputted (corresponding to s_e in FIG. 15) to the circuit H3 as unchanged. Thereby, the output from the AND circuit 201 in the circuit H3 is changed to the high level, so that the output from the OR circuit 211 in the circuit H3 is also changed to the high level, and this high-level signal is inputted to the OR circuit 211 in the circuit H4 below. Since the output from the OR circuit 211 in the lowermost circuit H of the column (the second column) to which the circuits H3 and H4 belong becomes the second bit data d1 of the readout data, the data stored in the storage region c6 is outputted as the second bit data d1.

In the circuit H3, the output from the OR circuit 212 is changed to the high level, and the signal evect6 is at the low level, whereby the output from the AND circuit 203 is changed to the high level. With this process, the high-level signal outputted from the AND circuit 203 is inputted to the circuit H4 below, and then, inputted (corresponding to s_w in FIG. 15) to the circuit H5 that is to the right of the circuit H4.

As for the circuit H6 to which the signal sft7 indicating the shift number 7, the signal evect7, and the data stored in the storage region c7 are inputted, the signal sft7 is at the low level. Therefore, the output from the AND circuit 201 is changed to the low level. The signal evect7 is at the high level, so that the high-level signal is inputted (corresponding to e_sftx in FIG. 15) to the next circuit H4 to the right. The data stored in the storage region c7 is also inputted (corresponding to abcx in FIG. 15) to the next circuit H4 to the right. The signal e_sftx and the signal abcx inputted to the circuit H4 are inputted to the next circuit H5 to the right as unchanged. As for the circuit H5, the signal e_sftx inputted from the circuit H4 is at the high level, so that the output from the AND circuit 201 becomes the low level. Accordingly, the output from the OR circuit 211 also becomes the low level. The output from the OR circuit 211 in the lowermost circuit H of the column (the third column) to which the circuit H5 belongs becomes the third bit data d2 of the readout data. However, the data (signal abcx) stored in the storage region c7 is not outputted as the third bit data d2.

On the other hand, in the circuit H5, the signal s_w and the signal e_sftx inputted from the circuit H4 are at the high level. Therefore, the output from the OR circuit 212 is changed to the high level, and the output (corresponding to s_s in FIG. 15) from the AND circuit 202 is also changed to the high level. The high-level signal from the AND circuit 202 is inputted (corresponding to s_n in FIG. 15) to the OR circuit 212 in the circuit H7 below.

As for the circuit H8 to which the signal sft8 indicating the shift number 8, the signal evect8, and the data stored in the storage region b0 are inputted, the signal sft8 is at the low level. Therefore, the output from the AND circuit 201 is changed to the low level. The signal evect8 is at the high level, so that the high-level signal is inputted (corresponding to e_sftx in FIG. 15) to the next circuit H9 to the right. The data stored in the storage region b0 is also inputted (corresponding to abcx in FIG. 8) to the next circuit H9 to the right. The signal e_sftx and the signal abcx inputted to the circuit H9 are inputted to the next circuit H7 to the right as unchanged. As for the circuit H7, the signal e_sftx inputted from the circuit H9 is at the high level, so that the output from the AND circuit 201 becomes the low level. Therefore, the data (signal abcx) stored in the storage region b0 is not outputted as the third bit data d2.

On the other hand, in the circuit H7, the signal s_n inputted from the circuit H5 and the signal e_sftx inputted from the circuit H9 are at the high level. Therefore, the output from the OR circuit 212 is changed to the high level, and the output (corresponding to s_s in FIG. 15) from the AND circuit 202 is also changed to the high level. The high-level signal from the AND circuit 202 is inputted (corresponding to s_n in FIG. 15) to the OR circuit 212 in the circuit H10 below.

As for the circuit H11 to which the signal sft9 indicating the shift number 9, the signal evect9, and the data stored in the storage region b1 are inputted, the signal sft9 is at the low level. Therefore, the output from the AND circuit 201 is changed to the low level. The signal evect9 is at the low level, so that the low-level signal is inputted (corresponding to e_sftx in FIG. 15) to the next circuit H12 to the right. The data stored in the storage region b1 is also inputted (corresponding to abcx in FIG. 15) to the next circuit H12 to the right. The signal e_sftx and the signal abcx inputted to the circuit H12 are inputted to the next circuit H10 to the right as unchanged. As for the circuit H10, the signal e_sftx inputted from the circuit H12 is at the low level, so that the output from the AND circuit 201 is changed to the high level, when the data stored in the storage region b1 is "1". Thereby, the output from the OR circuit 211 is changed to the high level, and this high-level signal is inputted to the OR circuit 211 in the circuit H2 below. When the output from the OR circuit 211 is changed to the high level, this output passes through all of the circuits H arranged below. The output from the OR circuit 211 in the lowermost circuit H of the column (the third column) to which the circuit H10 belongs becomes the third bit data d2 of the readout data. In this case, the data stored in the storage region b1 is outputted as the third bit data d2.

In the circuit H10, the signal_sn inputted from the circuit H7 is at the high level. Therefore, the output from the OR circuit 212 is changed to the high level. The signal e_sftx inputted from the circuit H12 is at the low level. Therefore, the output from the AND circuit 203 is changed to the high level. With this process, the high-level signal outputted from the AND circuit 203 is inputted to the circuit H13 below, and then, inputted (corresponding to s_w in FIG. 15) to the circuit H14 that is to the right of the circuit H13.

Similarly, the data stored in the storage region b2 is outputted as the fourth bit data d3, the data stored in the storage region b4 is outputted as the fifth bit data d4, the data stored in the storage region b6 is outputted as the sixth bit data d5, the data stored in the storage region b7 is outputted as the seventh bit data d6, and the data stored in the storage region a0 is outputted as the eighth bit data d7. In this manner, the readout data is generated by using the shift number "5" and the defective bit vector "0011001010000000".

Next, the generation of the readout data halfway through a page will be described. It is supposed here that the readout data is generated from the fourth byte (the byte position of "3"). FIG. 22 is a view illustrating an example of a part of a data structure of the bad-column storage unit 150 in this case. Here, out of the readout data, the data (byte position, integration byte shift, integration bit shift, defective bit vector) corresponding to the readout data (i.e., the readout data having the corresponding defective bit vector of "0000000000000000"), which is generated without skipping the output of the data from the storage region, is not stored in the bad-column storage unit 150. In FIG. 22, the defective bit vector corresponding to the readout data (the data on the fourth byte) indicated by the byte position "3" is "0000000000000000", and the data corresponding to this readout data is not stored in the bad-column storage unit 150.

Figure 23:
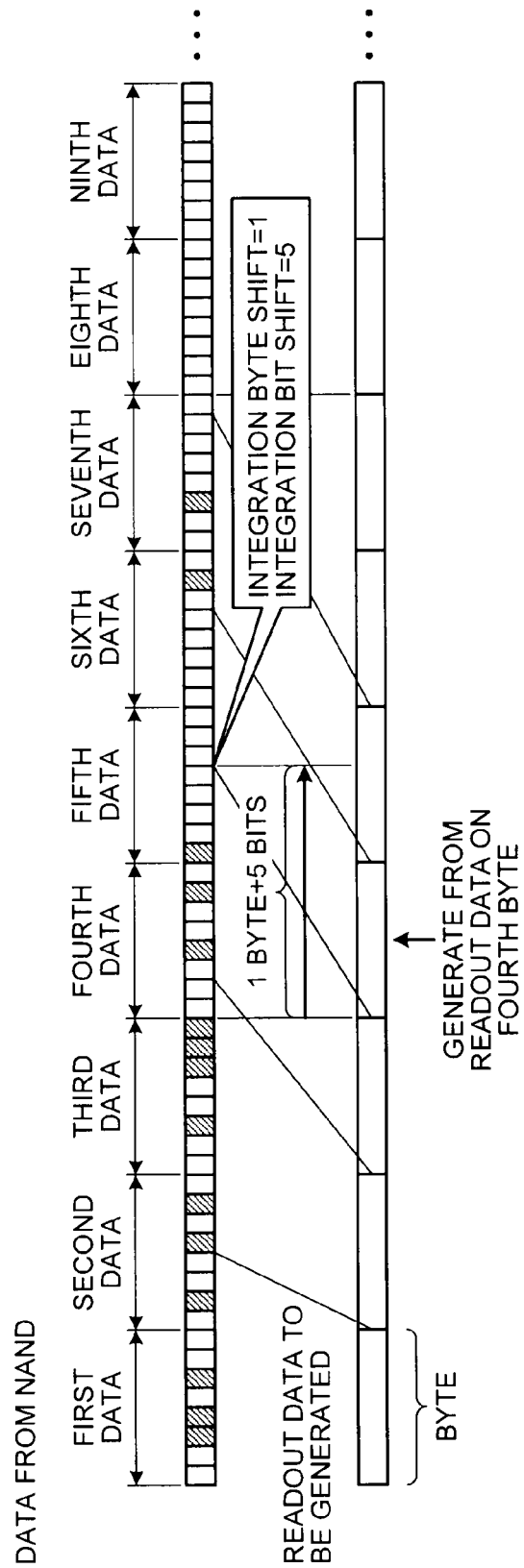
FIG. 23 is a conceptual view for showing generation of readout data from the middle of the page according to the embodiment.

When the readout data is generated from the fourth byte, the generating unit 163 finds that it overruns after the search to the byte position "4", and it returns by one to employ the integration byte shift of one and the integration bit shift of five at the byte position "2". This will further be described with reference to FIG. 23. The difference between the number of bytewise data sent from the buffer 23 and the number of the readout data in a unit of byte generated so far is "1", and the shift number in next process is "5"Therefore, when the readout data on the fourth byte is generated, the shift number of the fourth data sent from the buffer 23 from the head is 1 byte+5 bits=13 bits. As described above, the readout data on the fourth byte is generated without skipping the output of the data from the storage region. Therefore, the readout data on the fourth byte is generated from the 8-bit data that is sequentially taken from the bit, which is after the head bit of the fourth data sent from the buffer 23 by thirteen bits.

As described above, in the present embodiment, the data (write data or readout data) formed through the replacement of the bad column is generated one by one (in a time-sharing manner) in a byte unit. Therefore, each data in a unit of byte can be generated by repeatedly using a common circuit for generating the data formed through the replacement of the bad column. Accordingly, the scale of the circuit for generating the data formed through the replacement of the bad column can be reduced, and the utilization efficiency of the redundant unit can be enhanced by employing a bit unit for the unit of the replacement. Specifically, the data generation apparatus that can generate data in which the bad column is replaced can be provided with a simple configuration.

The embodiment of the present invention has been described above. The embodiment is only illustrative, and does not intend to restrict the scope of the present invention. The novel embodiment can be embodied with other various embodiments, and various omissions, replacements, and modifications are possible without departing from the scope of the present invention. The embodiment and its modifications are included in the scope of the present invention, and in the inventions and their equivalent scopes described in the claims. The number of the data lines 22 belonging to each sector is not limited to 8, and this number can optionally be changed, for example.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A data generation apparatus comprising:
  a first storage unit that stores identification information and defective information in association with each other, the identification information identifying a plurality of sectors, the sectors being regions including a first number of data lines to each of which a memory cell is connected, the defective information indicating a presence of defect on the data line belonging to the sector identified by the identification information;
  a second storage unit having storage regions in a number larger than the first number, the storage regions being connected in series;
  an input unit configured to input one by one the first number of data having been sent from a host device to the second storage unit;

a shift number determining unit configured to determine a shift number indicating a value corresponding to the number of the data lines having a defect; and an output unit configured to output write data that is supplied to a sector based upon the defective information corresponding to the identification information of the sector, the write data being output as the write data to be supplied to a defect-free data line in the sector, the write data being data stored in one of the storage regions and being output one by one starting from a storage region which is after a head storage region by the shift number, and the write data to be supplied to a defective data line in the sector, the write date being information that differs from the data, wherein, when the second storage unit accepts the first number of the data that is inputted by the input unit, the second storage unit writes the data, which has already been stored in the storage regions, to the storage regions on a head side by the first number, and writes the first number of the data that is inputted by the input unit to each of the first number of storage regions counted from a terminal side.

2. The apparatus according to claim 1, further comprising an input controller that controls the input unit to input the first number of data to the second storage unit, wherein the second storage unit is configured to include the storage regions in a number double the first number.

3. The apparatus according to claim 2, wherein the shift number determining unit determines the shift number at generation of the next write data according to the number of the storage regions from which the data has already been outputted, every time the output unit outputs the write data.

4. The apparatus according to claim 3, wherein the shift number determining unit determines the number of the storage regions from which the data has already been outputted as the shift number at generation of the next write data when the number of the storage regions from which the data has already been outputted is less than the first number, and, determines a value obtained by subtracting the first number from the number of the storage regions from which the data has already been outputted as the shift number at generation of the next write data when the number of the storage regions from which the data has already been outputted is greater than the first number.

5. The apparatus according to claim 1, wherein the first storage unit does not store the identification information for identifying the sector and the defective information as being associated with each other, with respect to the sector to which the defective data line does not belong.

6. A data generation apparatus comprising:

a first storage unit including a plurality of storage regions that are connected in series;

an input unit configured to control a memory cell array including a plurality of data lines so as to divide the data which is outputted from each of the plurality of data lines to which a memory cell storing data is connected for each sector in a unit of a first number of data lines and to sequentially input the data to the first storage unit;

a second storage unit that stores identification information for identifying readout data, which is sequentially generated in a unit of the first number of data outputted from a defect-free data line among the plurality of data lines, defective information for specifying the storage region from which the output of the data is skipped during the generation of the readout data, and a shift number indicating a value corresponding to the first number of defective data lines, while the identification information, the defective information, and the shift number are made to associate with one another; and a generating unit that outputs one by one the first number of data stored in the storage regions other than the storage region storing the data outputted from a defective data line starting from a storage region, which is after the head storage region by the shift number, in that way generating the readout data, wherein the first storage unit has the storage regions in a number larger than the first number, and when accepting the data that is inputted by the input unit, writes the data that has already been stored in the storage region to the storage regions on a head side by the first number, and writes the first number of the data that is inputted by the input unit to each of the first number of storage regions counted from a terminal side.

7. The apparatus according to claim 6, wherein the first storage unit is configured to include the storage regions in a number three times the first number; and the generating unit determines a period during when the next readout data is not to be generated according to the shift number and the number of the storage regions from which the output of the data is skipped, every time the readout data is generated.

8. The apparatus according to claim 7, wherein in case where the sum of the shift number and the number of the storage regions from which the output of the data is skipped is one or more and less than the first number when the readout data is generated, the generating unit does not generate the next readout data during a period after the generation of the readout data until the input of the first number of data to the first storage unit, and in case where the sum of the shift number and the number of the storage regions from which the output of the data is skipped is greater than the first number, the generating unit does not generate the next readout data during a period after the readout data is generated until the data in the number double the first number is input to the first storage unit.

9. The apparatus according to claim 6, wherein the second storage unit does not store the identification information of the readout data, the defective information, and the shift number as being associated with one another, with respect to the readout data which is generated without the output of the data from the storage region being skipped.

* * * * *